United States Patent [19]

Morita et al.

[11] Patent Number: 5,089,355
[45] Date of Patent: Feb. 18, 1992

[54] FLEXIBLE METAL CLAD LAMINATE, PRODUCTION METHOD THEREOF AND APPARATUS FOR THE METHOD

[75] Inventors: Moritsugu Morita, Yokosuka; Takushi Sato, Yokohama; Shusuke Yamanaka, Yokosuka; Shunji Yoshida; Kenji Tanabe, both of Yokohama; Mitsuyuki Naito, Tokyo; Shigeyuki Shishido, Kamakura, all of Japan

[73] Assignee: Mitsui Toatsu Chemicals, Incorporated, Tokyo, Japan

[21] Appl. No.: 360,909

[22] PCT Filed: Sep. 22, 1988

[86] PCT No.: PCT/JP88/00958

§ 371 Date: May 3, 1989

§ 102(e) Date: May 3, 1989

[87] PCT Pub. No.: WO89/02822

PCT Pub. Date: Apr. 6, 1989

[30] Foreign Application Priority Data

| Sep. 24, 1987 | [JP] | Japan | 62-237494 |
| Sep. 25, 1987 | [JP] | Japan | 62-238864 |
| Sep. 25, 1987 | [JP] | Japan | 62-238865 |
| Sep. 25, 1987 | [JP] | Japan | 62-238867 |
| Sep. 25, 1987 | [JP] | Japan | 62-239003 |

[51] Int. Cl.⁵ .................. B32B 15/08; B21D 1/00
[52] U.S. Cl. .................. 428/607; 428/626; 428/409; 428/457; 428/458; 72/166
[58] Field of Search .......... 428/607, 624, 625, 626, 428/409, 422, 458, 457, 461, 686; 72/166, 167, 169, 183

[56] References Cited

U.S. PATENT DOCUMENTS

| 1,048,793 | 12/1912 | Beeman et al. | 72/164 |
| 2,383,964 | 9/1945 | Grupe | 117/7 |
| 2,495,909 | 1/1950 | Ross | 270/5 |
| 2,653,643 | 9/1953 | Miller et al. | 153/54 |
| 2,750,984 | 6/1956 | Miller | 153/54 |
| 3,076,492 | 2/1963 | Monks | 153/85 |
| 3,179,634 | 4/1965 | Edwards | 260/78 |
| 3,315,514 | 4/1967 | Larsen et al. | 72/169 |
| 3,461,703 | 8/1969 | Ranney | 72/183 |
| 3,540,252 | 11/1970 | Pfanner | 72/166 |
| 3,559,438 | 2/1971 | Rouyer et al. | 72/160 |
| 3,590,620 | 7/1971 | Lowery | 72/166 |
| 3,954,570 | 5/1976 | Shirk et al. | 204/15 |
| 4,035,694 | 7/1977 | Barton et al. | 361/400 |
| 4,060,236 | 11/1977 | Carstedt | 271/183 |
| 4,106,166 | 8/1978 | Henning | 28/103 |
| 4,198,458 | 4/1980 | Mitsuishi et al. | 428/409 |
| 4,300,891 | 11/1981 | Bemiss | 493/8 |
| 4,353,954 | 10/1982 | Yamaoka et al. | 428/216 |
| 4,360,356 | 11/1982 | Hall | 493/459 |
| 4,517,042 | 5/1985 | Singer | 156/164 |
| 4,528,833 | 7/1985 | Inaike et al. | 72/166 |
| 4,788,846 | 12/1988 | Morita et al. | 72/183 |

FOREIGN PATENT DOCUMENTS

| 962037 | 4/1957 | Fed. Rep. of Germany . |
| 49-129862 | 12/1974 | Japan . |
| 54031480 | 8/1977 | Japan . |
| 54066966 | 11/1977 | Japan . |
| 54-108272 | 2/1978 | Japan . |
| 54-111673 | 2/1978 | Japan . |
| 55072095 | 11/1978 | Japan . |
| 55-160489 | 5/1979 | Japan . |
| 56023791 | 8/1979 | Japan . |
| 54-149351 | 11/1979 | Japan | 72/183 |
| 56-23791 | 3/1981 | Japan . |
| 58-190091 | 11/1983 | Japan . |
| 59-22388 | 2/1984 | Japan . |
| 59-22389 | 2/1984 | Japan . |
| 59-209406 | 11/1984 | Japan | 72/166 |

Primary Examiner—John J. Zimmerman
Attorney, Agent, or Firm—Fisher, Christen & Sabol

[57] ABSTRACT

An elongated flexible metal clad laminate formed of at least one metal layer and at least one plastic layer and having a smaller interlayer dimensional difference and excellent process-ability. A defect that a dimension of the metal layer is longer than a corresponding dimension of the plastic layer when they are compared to each other as discrete layers has been corrected by causing the metal layer to continually undergo compression plastic deformation in the form of the laminate and hence compressing the metal layer. A production method for the laminate and an apparatus for the method.

16 Claims, 10 Drawing Sheets

FIG. 9
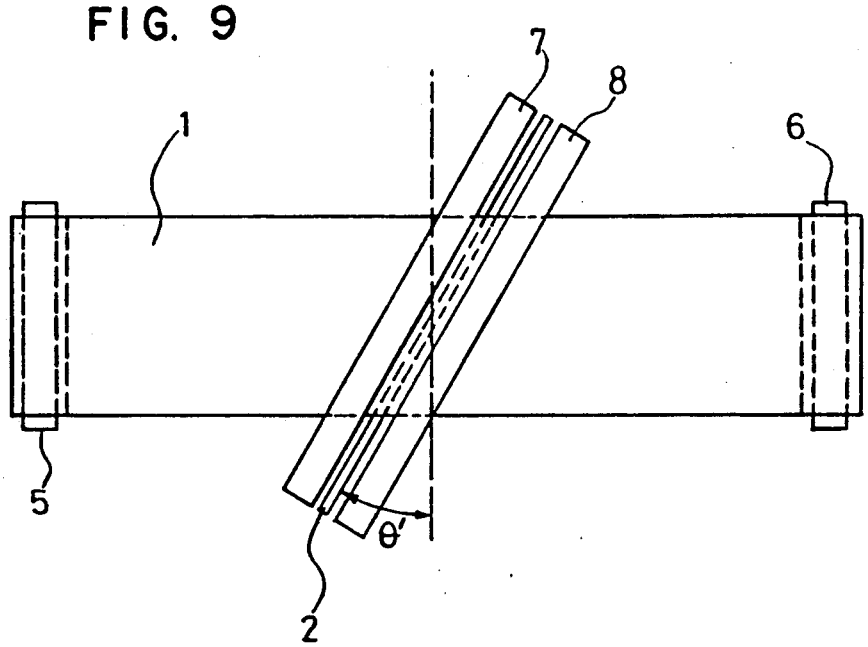
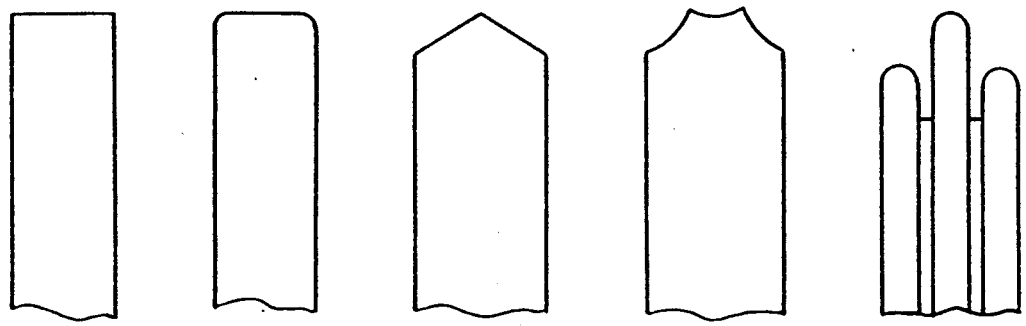
FIG.10(a)  FIG.10(b)  FIG.10(c)  FIG.10(d)  FIG.10(e)
FIG.10(f)  FIG.10(g)  FIG.10(h)  FIG.10(i)
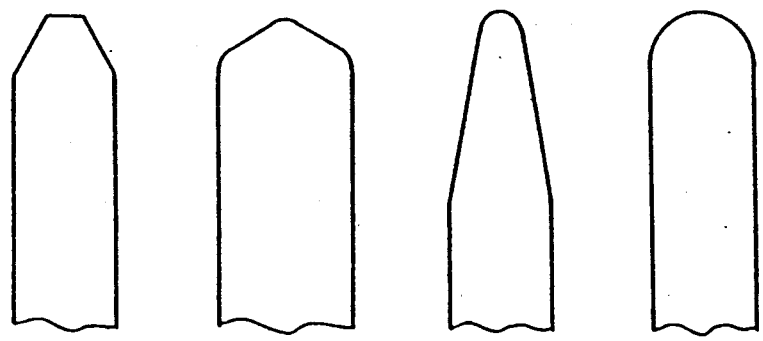

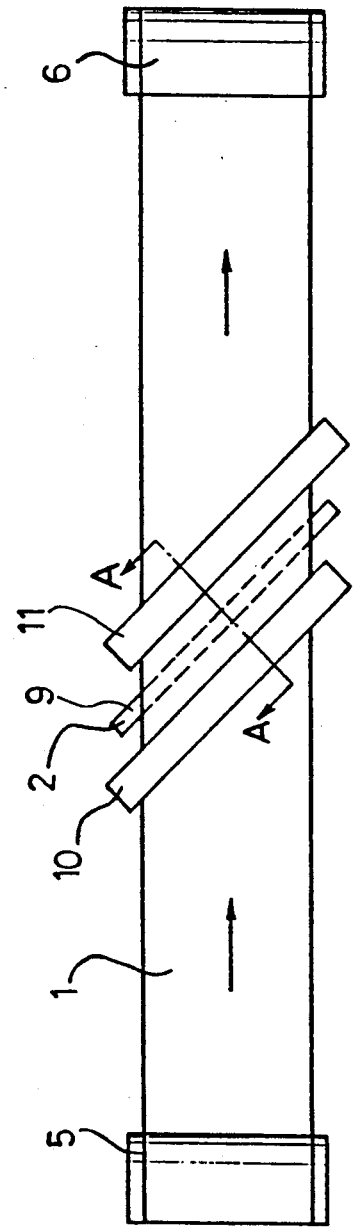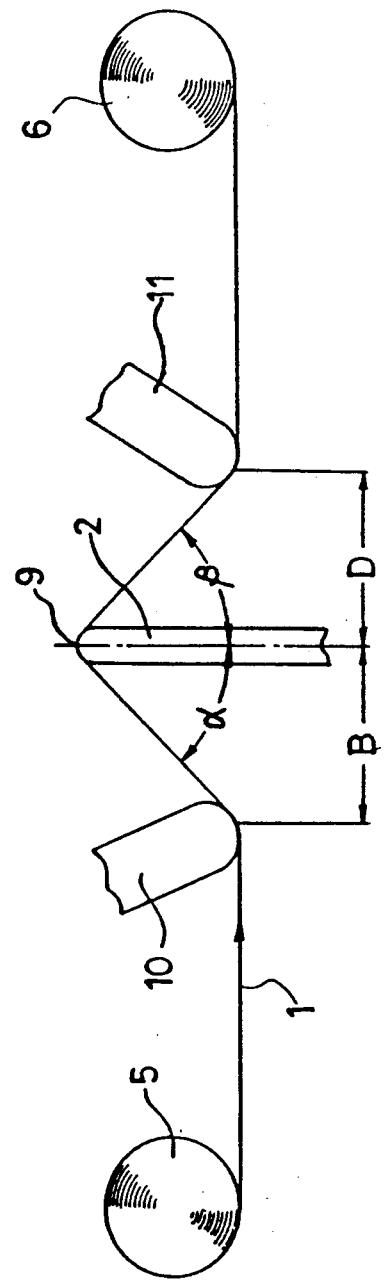

FLEXIBLE METAL CLAD LAMINATE, PRODUCTION METHOD THEREOF AND APPARATUS FOR THE METHOD

DESCRIPTION

1. Technical Field

This invention relates to an elongated flexible metal clad laminate (hereinafter abbreviated as "FMCL") which includes a layer of a function plastic, e.g., a plastic excellent in heat resistance, electrical characteristics and mechanical characteristics such as a polyimide, a low dielectric-constant plastic such as polytetrafluoroethylene, a heat-sealable plastic such as polyethylene or a chemical resistant plastic such as polypropylene, and a metal layer having electrical conductivity, heat conductivity, electromagnetic shielding properties, gas barrier properties and the like, and which is useful in application fields such as the electrical, electronic, packaging and ornamentation fields. This invention is concerned with a flexible metal clad laminate formed of at least one metal layer and at least one plastic layer and having a smaller interlayer dimensional difference and excellent processability. A defect occurred in the step of lamination between the metal layer and plastic layer or a like step, that a dimension of the metal layer is longer than a corresponding dimension of the plastic layer when they are compared to each other as discrete layers, has been successfully corrected by causing the metal layer to continually undergo compression plastic deformation in the form of the laminate and hence compressing the metal layer. This invention also relates to a production method of the flexible metal clad laminate and to an apparatus for practising the method.

2. Background Art

Flexible metal clad laminates (FMCLs) formed of at least one metal layer and at least one plastic layer are used as materials making full use of characteristics of both a metal and a plastic, for example, as wrapping materials, substrates for flexible printed circuits, covering materials for electromagnetically-shielded wires and cables, electromagnetically-shielding films, etc.

It is necessary for these FMCLs that a suitable dimensional relationship be satisfied between a metal layer and its associated plastic layer in view of processing means and application purposes.

However, the production of FMCL is generally conducted by bonding a metal foil and a plastic film with an adhesive under heat, continually forming a plastic film over a metal foil, coating a metal foil with a solvent solution of a plastic polymer, or forming a metal on a plastic film by sputtering, vacuum evaporation or electroless plating. There is therefore a dimensional difference, in general, of about 0.1-5% between the metal layer and plastic layer due to the difference in the coefficient of thermal expansion, tensile strength, compression strength, the modulus of elasticity or percentage water absorption between the metal and plastic, the occurrence of shrinkage upon drying of the solvent, the occurrence of shrinkage upon curing. Although the tolerable dimensional difference varies from one application field to another, the dimensional difference tends to fall outside of a desired tolerable range in many instances. Those engaged in the present field of art hence have difficulties in coping with inconvenience caused by such a dimensional difference. For example, this dimensional difference is required not to exceed 0.3% in the field of flexible printed circuit boards and 0.05% in the field of TAB (tape automated bonding).

Although such a dimensional difference cannot be quantitatively measured so long as FMCL is measured as is. Its measurement is however feasible provided that the elements, namely, the metal layer and plastic layer are separated from each other into discrete elements by a method not inducing a stress.

In many instances, the dimension of a plastic layer is generally smaller than a suitable range, in other words, shorter compared to the dimension of its associated metal layer.

A shorter plastic layer brings about adverse effects, which may be divided into the following two types roughly.

a) FMCL is curled with the plastic layer being located inside. Extreme difficulties are therefore encountered upon its further working or processing in which FMCL must be worked or processed in a developed form, for example, upon stamping, cutting, patterning, superposing and bonding, and/or the like.

b) Upon printing a precise circuit pattern with an etching resist ink and then conducting etching to leave the metal layer partially as typified by a flexible printed circuit board (FPC), a dimensional difference occurs between a portion where the metal layer still remains and another portion where the metal layer has been removed, so that creases are formed all over the laminate.

As a result, the relative positional relationship among individual points on the pattern varies so that the preciseness required for the mounting of parts or for the establishment of a connection to another pattern is lost and its external appearance is also rendered less attractive.

Where the dimension of the plastic layer is shorter beyond a certain specific range compared to that of the associated metal layer, the laminate is actually considered to have no practical utility.

Since there is generally no method capable of completely separating the individual elements into discrete elements without applying any additional stress, the following method can be adopted by way of example for the measurement of such dimensional differences as a practical separation method capable of practically avoiding the occurrence of further stress. Namely, the dimension of FMCL is measured as is. The value thus measured is deemed to be equal to the dimension of the metal layer, namely, to the dimension of the plastic layer before etching. FMCL is thereafter subjected to etching with a reagent which does not give influence to the plastic layer, so that the metal layer is removed to isolate the plastic layer. The dimension of the plastic layer is measured and is deemed to be the dimension of the plastic layer. From these measurement data, the dimensional difference between both the layers, which is equal to the difference obtained by subtracting the length of the plastic layer after the etching from that of the plastic layer before the etching, is determined.

In some instances, a variety of measures has heretofore been taken with a view toward eliminating the above-mentioned drawbacks which are considered to be fatal to FMCLs as products. No FMCL of satisfactory properties has however been completed yet.

As one example of techniques already known, there is a simple curl-removing method in which as disclosed in Japanese Patent Laid-Open Nos. 22388/1984 and 22389/1984, a flexural plastic deformation opposite to the curl is applied to a metal layer, in other words, the curled metal layer is bent in a direction opposite to the curl, so that the resultant deformation is balanced with the stress responsible to the development of the curl due to the dimensional difference between the metal layer and its associated plastic layer, thereby hopefully reducing the curl.

It is important to note that needless to say, the dimension of the metal layer itself is practically unchanged before and after the processing in the above instance.

In FMCL processed by such a method, the curl caused as the adverse effect (a) by the shorter dimension of its plastic layer has only been eliminated tentatively. There is thus a drawback that the curl appears again immediately when FMCL has a thermal history. With respect to the adverse effect (b), namely, the development of creases upon etching, the above method is also accompanied by a serious drawback that no substantive improvement has been made at all in the problem because the dimensional difference between the plastic layer and metal layer was practically unchanged before and after the processing and remains as was.

On the other hand, some attempts have been made with a view toward selectively stretching a plastic layer to make it close to the dimension of its associated metal layer.

In Japanese Patent Laid-Open No. 23791/1981, it is attempted to make the dimension of a plastic layer close to that of its associated metal layer by causing the plastic layer to absorb a solvent and hence to swell to have a longer length.

This method is however accompanied by a drawback that the plastic layer shrinks again unavoidably because the thus-absorbed solvent escapes from the plastic layer when FMCL is exposed to a high temperature, for example, to an atmosphere of 100° C. or higher or is left over for a long period of time in the atmosphere. The above method is accompanied by another problem that it is still very difficult to reduce the dimensional difference from the metal layer to a predetermined necessary range. The method of the present invention in which the dimension of a metal layer is reduced by compression plastic deformation, which is reasonable from the theoretical viewpoint and allows very small dimensional changes along the passage of time, has not been found in any prior art techniques.

DISCLOSURE OF THE INVENTION

An object of this invention is to provide an elongated FMCL which includes a function plastic composed of a heat-resistant plastic, low dielectric-constant plastic, heat-sealable plastic or chemical resistant plastic or a combination thereof and a metal foil having various characteristics, is useful in an application field such as the electrical, electronic, packaging or ornamentation field, and has excellent processability and/or workability. A defect produced in the step of their lamination or a similar step that the dimension of the metal layer is longer than that of the plastic layer when the metal layer and plastic layer can be separated from each other can be corrected by continually subjecting the metal layer to compression plastic deformation and hence compressing the metal layer in the form of the laminate and the thus-corrected dimensional difference does not change along the passage of time. Another object of this invention is to provide a method for the production of the laminate. A further object of this invention is to provide an apparatus for practising the method.

When the dimension of a metal layer is longer than that of its associated plastic layer, their dimensional difference is reduced by continually subjecting the metal layer to compression plastic deformation and hence reducing its dimension. For this purpose, the flexural stiffness of the metal layer may preferably be 20 g.cm or smaller while that of the plastic layer may preferably be at least 1/500 of the flexural rigidity of the metal layer.

Namely, the present invention can be practised efficiently by setting the thickness of the metal layer to give a flexural rigidity of 20 g.cm or smaller and the thickness of the plastic layer to give a flexural rigidity at least 1/500 of the flexural rigidity of the metal layer where the materials constituting FMCL have been chosen.

Since many of FMCLs useful in application fields such as the electrical, electronic, packaging and ornamentation fields satisfy the above-described requirements in characteristics, they have significant advantages such that they allow to reduce the dimensional differences between their plastic layers and metal layers, permit a variety of processing and/or working and in addition, provide processed or worked products having an improved processing or working accuracy, whereby a significant contribution has been brought about to the industry.

BRIEF DESCRIPTION OF THE DRAWINGS

FIG. 9 is a schematic plan view of a situation in which the line angle of FIG. 8 has been set opposite;

FIGS. 10(a) to 10(i) depict in transverse cross-section blades of various shapes;

FIGS. 11(1) and 11(2) are schematic plan view and vertical cross-section respectively where guides are provided in accordance with this invention;

Figure 2:
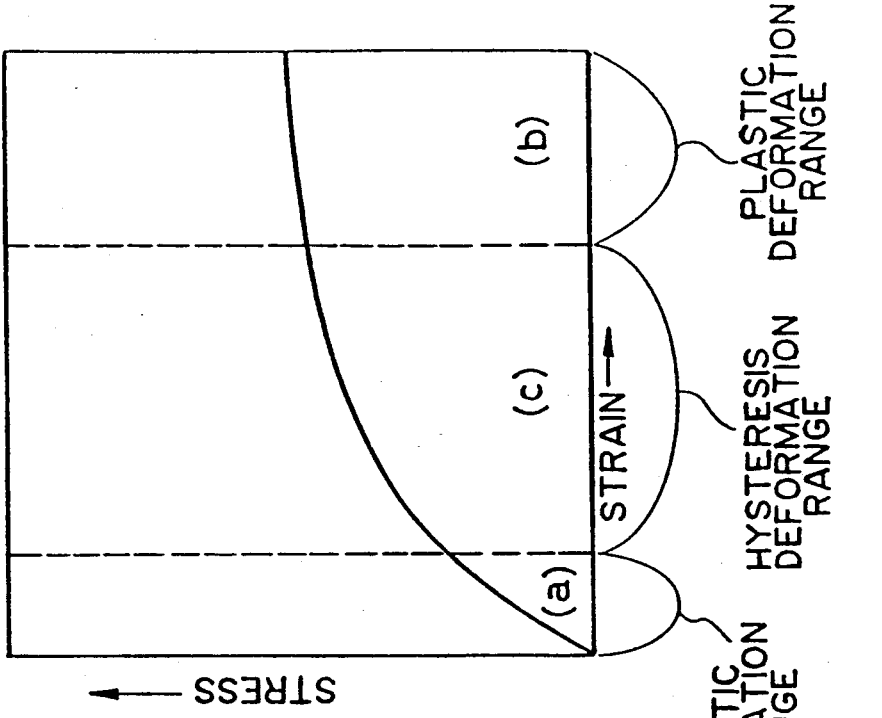
FIG. 2 is a diagram of a stress-strain curve of a polyimide as a representative example of plastics.

In the drawings, there are illustrated FMCL 1, blade 2, metal layer 3, plastic layer 4, feeder or let-off guide roll 5, take-up machine or winding guide roll 6, guide roller 7, guide roller 8, blade edge portion 9, guide 10, guide 11, guide-in angle α, guide-out angle β, and line angles θ,θ'.

BEST MODES FOR CARRYING OUT THE INVENTION

The most significant technical feature of the present invention resides in that upon reducing an interlayer dimensional difference in FMCL in which a metal layer is longer compared to its corresponding plastic layer, the objective is achieved by concentrating attention on on the metal layer instead of the plastic layer and subjecting the metal layer to compression plastic deformation. When FMCL is used as a substrate for a printed circuit, the dimensional difference between its metal layer and plastic layer should preferably fall within 0.3%. In the case of a fine-patterned circuit in particular, 0.1% or smaller is preferred with 0.05% or smaller being especially preferred. The dimensional difference should be 0% ideally.

In order to reduce the dimensional difference between a metal layer and its associated plastic layer in FMCL where the metal layer is longer than the plastic layer, it is necessary either to cause the plastic layer to expand close to the dimension of the metal layer or to cause the metal layer to contract close to the dimension of the plastic layer. It is however considered to be absolutely impossible by those skilled in the art to cause a thin metal layer of 100 μm or less, which may generally be called a "metal foil", to undergo a compression plastic deformation. The method which has been practised usually to date is to stretch the plastic layer close to the dimension of the associated metal layer as mentioned in the background art. No satisfactory results have however been brought about from the method of stretching the plastic layer close to the dimension of the associated metal layer. The present inventors thoroughly studied properties of metal layers, properties of plastic layers, etc. In complete contrast to the common knowledge of those skilled in the art and methods practised by them to date, it has been found as the only method for obtaining FMCL with a reduced interlayer dimensional difference that the metal layer is subjected to compression plastic deformation so as to make the dimension of the metal layer close to that of the plastic layer. A method for applying a compression plastic deformation to the metal layer has also been found. As a result, the present invention has been completed.

Figure 1:
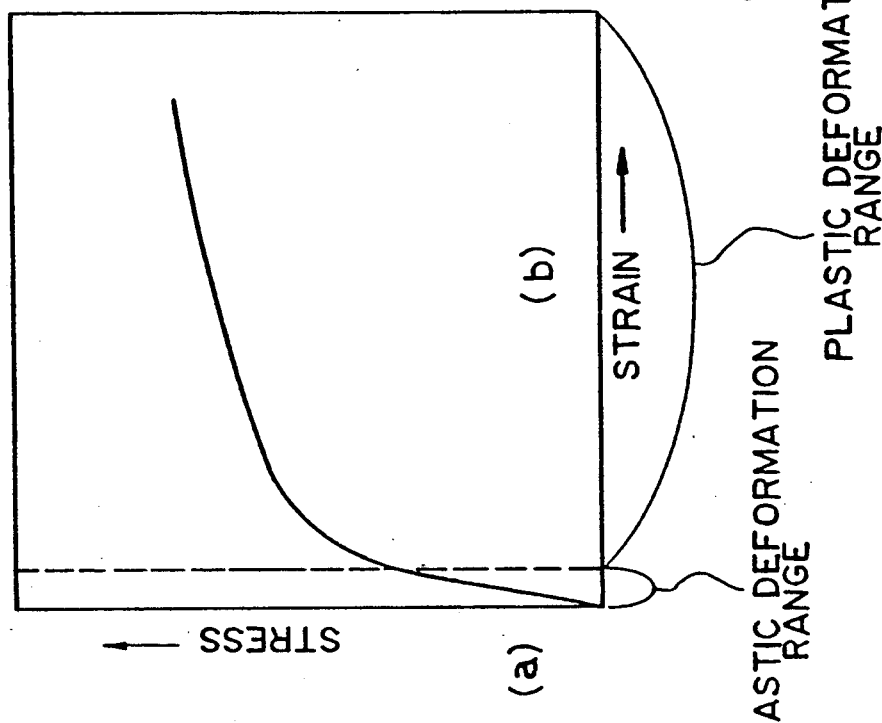
FIG. 1 is a diagram of a stress-strain curve of copper as a typical example of metal layers.

First of all, the principle of subjecting a metal layer to compression plastic deformation in the present invention will be described with reference to some of the drawings. Although a metal layer generally has a greater modulus of elasticity compared to an associated plastic layer, plastic deformation amounts to a major proportion of the deformation. The stress-strain curve of a copper foil as a typical example of metal layer is shown in FIG. 1, while the stress-strain curve of a polyimide film as an illustrative plastic layer is depicted in FIG. 2. The ranges indicated by (a) and (b) in both FIG. 1 and FIG. 2 can be considered as elastic and plastic deformation ranges respectively. On the other hand, the range designated by (c) in FIG. 2 is a range in which a plastic exhibits a hysteresis deformation. The stress range in which an elastic deformation is feasible is wide provided that the strain range featuring hysteresis is also considered to be an elastic range. Since the elastic range of a plastic is far broader than that of a metal, it is possible to establish a range, in which a plastic layer undergoes only an elastic deformation without developing any plastic deformation in spite of development of a plastic deformation in the metal layer, by suitably controlling the stresses to be applied to the metal layer and plastic layer respectively. This range can be established only when the flexural rigidity of the metal layer and that of the plastic layer satisfy a certain mutual relationship. In this invention, a stress in the above range is applied to both the metal layer and the plastic layer so as to develop a compression plastic deformation of from 0.01% to 5% in the metal layer of FMCL.

Figure 3:
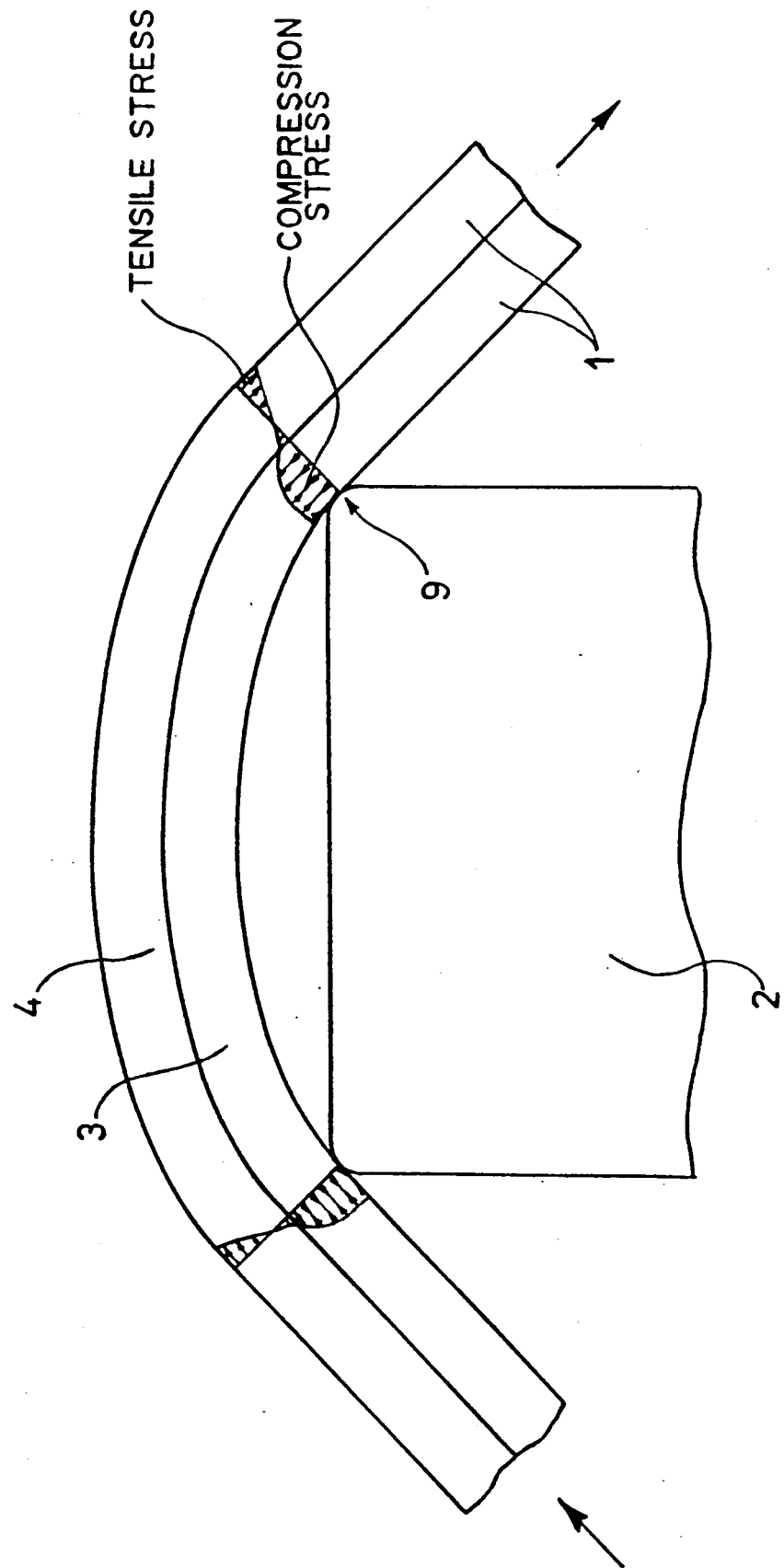
FIG. 3 is a vertical cross-section showing a state in which a metal layer of FMCL has developed a compression plastic deformation.

In order to develop such a compression plastic deformation as described above in this invention, an operation is carried out as shown in FIG. 3. Namely, FIG. 3 is a drawing illustrating an operation for causing a metal layer to undergo a compression plastic deformation as seen in a direction transverse to FMCL. Of the metal layer and plastic layer both forming FMCL, the metal layer to be subjected to compression plastic deformation is continually bent in contact with a blade. As illustrated in FIG. 3, in FMCL bent on the blade 2, the inner metal layer 3 is subjected a compression stress while the outer plastic layer 4 is subjected to a tensile stress. The dimensional difference between the metal layer and the plastic layer in FMCL that the metal layer is longer compared to the plastic layer can be reduced by choosing a suitable stress here and subjecting the metal layer 3 and plastic layer 4 to compression plastic deformation and tensile elastic deformation, respectively.

In order to have the metal layer and plastic layer of FMCL undergo compression plastic deformation and tensile elastic deformation respectively as described above, the flexural rigidity of the metal layer may preferably be not greater than 20 g.cm but not smaller than $1 \times 10^{-8}$ g.cm, while that of the plastic layer may preferably be at least 1/500 but at most $6 \times 10^9$ of the flexural rigidity of the metal layer with a range of at least 1/100 but at most $1 \times 10^5$ being more preferred.

When the flexural rigidity of the metal layer and that of the plastic layer preferably, namely, are 20 g.cm or smaller and 1/500 of the flexural rigidity of the metal layer or greater respectively, the metal layer undergoes a plastic deformation as shown in FIG. 3 owing to the balance in flexural rigidity between the metal layer and the plastic layer, whereby a compression plastic deformation is developed throughout the layer.

On the other hand, a tensile stress is applied to the plastic layer. The effect of the tensile stress is however limited practically to the development of an elastic deformation so that no substantial change takes place regarding the dimension of the plastic layer.

These results are combined together in this invention, so that only the compression plastic deformation of the metal layer remains as a permanent contraction in FMCL processed as described above. As a result, FMCL itself undergoes a contraction and the dimensional difference between the metal layer and plastic layer is reduced accordingly, whereby the dimensional difference is removed practically and substantially. In other words, the metal layer is subjected to compression plastic deformation to undergo a contraction, so that the dimension of the metal layer is reduced close to that of the plastic layer and the dimensional difference is reduced correspondingly.

By controlling the flexural rigidity within the above-described range, it is possible to perform a control such that a greater stress is applied to the metal layer to produce a greater compression plastic deformation and a smaller tensile strain is exerted to the plastic layer.

Where a plastic layer is longer than an associated metal layer in FMCL on the contrary, the dimensional difference between the plastic layer and metal layer in FMCL can also be removed practically and substantially by conducting a similar processing except that the plastic layer is maintained in contact with the blade in contrast to the above-described processing whereby the metal layer undergoes an expanding plastic deformation and is hence stretched.

Incidentally, if the flexural rigidity of a metal layer exceeds 20 g.cm, the rigidity is so strong that the metal layer seems to undergo a flexural plastic deformation only and no compression deformation appears to be feasible therefor. If the flexural rigidity of a plastic layer is smaller than 1/500 of that of the metal layer, the rigidity of the metal layer is too strong compared to the plastic layer so that the metal layer appears to undergo a flexural deformation alone.

Figure 4:
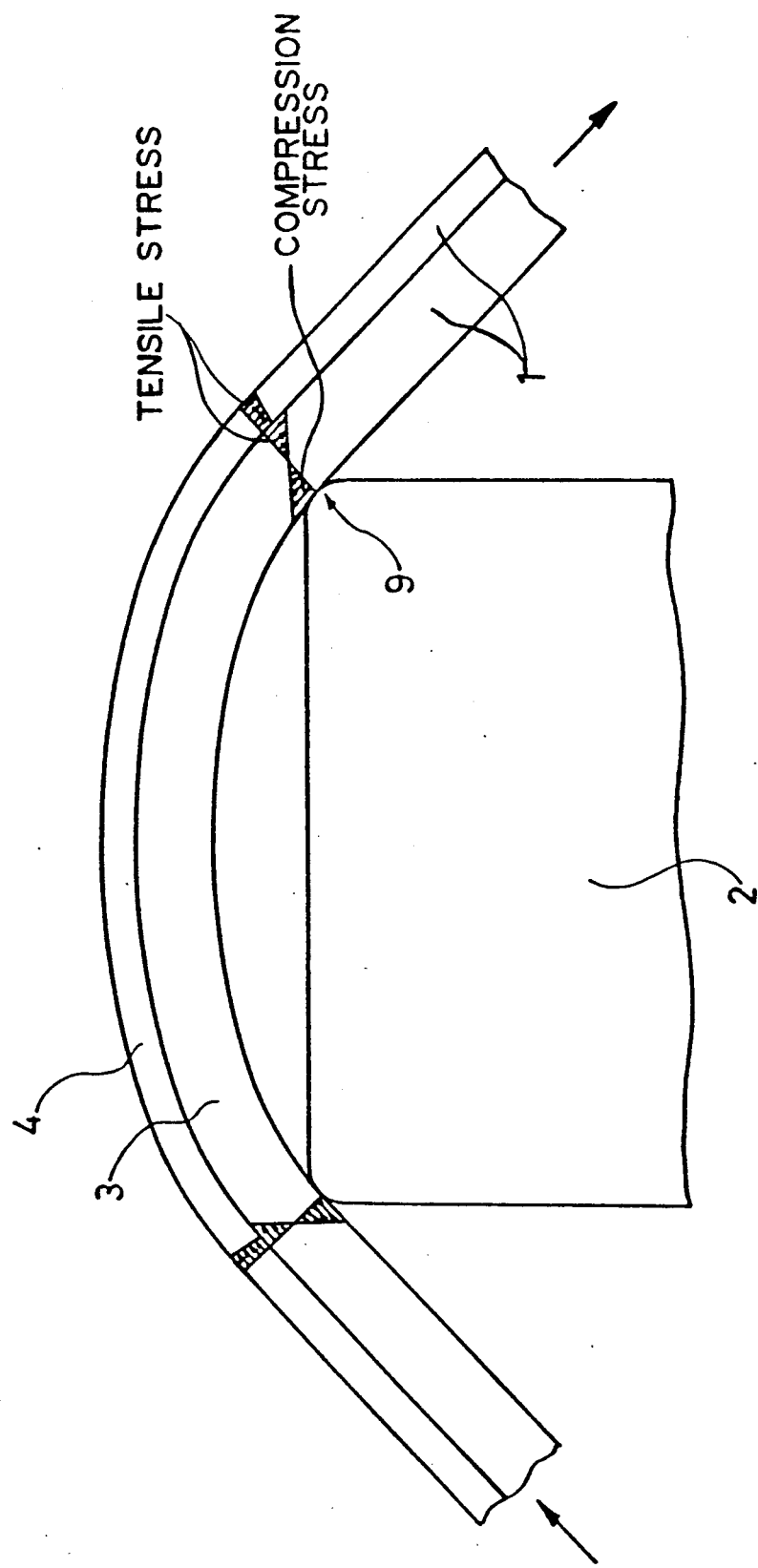
FIG. 4 is a vertical cross-section showing a state in which a metal layer of FMCL has developed a flexural deformation.

This may be described more clearly. When the flexural rigidity of each of the metal layer and plastic layer falls outside its corresponding range specified in the present invention, both a tensile stress and a compression stress occur simultaneously in the metal layer as illustrated in FIG. 4 so that the metal layer undergoes a flexural deformation only. The dimensions of the metal layer have not therefore been changed when the metal layer is taken as a whole, whereby no relative dimensional change has taken place with respect to the plastic layer. Accordingly, it does not appear to be feasible to reduce the dimensional difference between both the layers.

Figure 5:
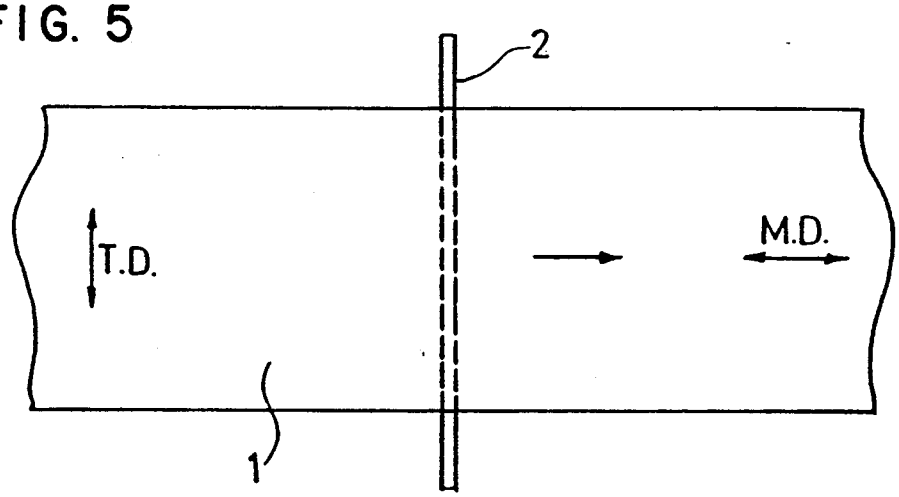
FIG. 5 is a plan view of FMCL as seen from the side of a plastic layer of FMCL and illustrates an operation in which FMCL is continually bent.

In the present invention, based on the above-described principle, a stress is applied to FMCL and a metal layer is hence undergoes a compression plastic deformation. Described specifically, FMCL is continually bent under tension at a certain speed on a blade. FIG. 5 is a drawing as seen from the side of a plastic layer of FMCL, which illustrates an operation in which FMCL is continually bent. Namely, when FMCL 1 is fed under tension in a direction indicated by an arrow, for example, by a means such as a let-off machine or guide roll and a take-up machine or take-up roller which are both arranged in a level different from the edge of the blade, FMCL 1 is continually bent on the blade 2 which is arranged in parallel with the width of FMCL and in contact with FMCL. The cross-section of FMCL at this time may be illustrated as shown in FIG. 3 and the metal layer 3 is caused to undergo a compression plastic deformation in accordance with the principle mentioned above. For illustration purposes, assume that the operation of FIG. 5 is performed. Since the stresses exerted respectively on the metal layer 3 and plastic layer 4 of FMCL 1 are in a vertical direction relative to the blade, namely, in the travelling direction (hereinafter called the "machine direction"), the direction of contraction of the metal layer is also the machine direction of FMCL 1. Practically no stress therefore occurs in the direction of the width (hereinafter called the "transverse direction") of FMCL 1, so that a reduction in the dimensional difference between the metal layer and plastic layer constituting FMCL 1 can be achieved only in the machine direction of FMCL 1. When there is a dimensional difference such that the metal layer is longer and the plastic layer is shorter only in the machine direction for a certain cause, for example, by a tension applied in the machine direction in the step in which the metal layer and plastic layer have been laminated, FMCL having a small dimensional difference between its metal layer and plastic layer in all directions can be obtained by reducing their dimensional difference in the machine direction by the operation depicted in FIG. 5. A dimensional difference however exists in each of the machine and transverse directions between the metal layer and plastic layer of FMCL in most instances.

Figure 6:
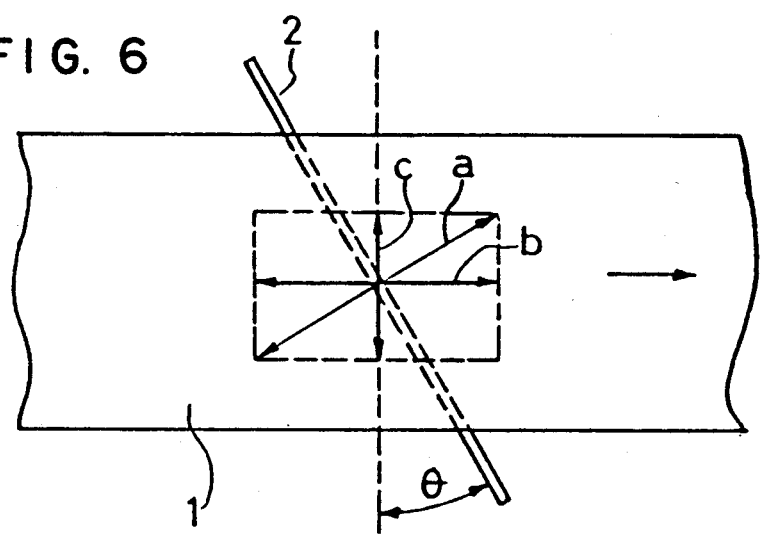
FIG. 6 and FIG. 7 are diagrams showing the direction of a compression plastic deformation of a metal layer of FMCL.

In the case of such FMCL, the dimensional differences in desired directions, namely, in all directions between the metal layer and plastic layer can be reduced by bending FMCL continually on a blade disposed at a predetermined angle relative to the machine direction of FMCL. FIG. 6 is a view as seen from the side of a plastic layer of FMCL and shows an operation in which FMCL is bent continually. In FIG. 6, the blade 2 is arranged at an angle indicated by θ relative to FMCL 1. The angle indicated by θ means an angle over which the blade is deviated from the transverse direction of FMCL as a standard line. The counterclockwise direction is indicated by a positive angle, while the clockwise direction is designated by a negative angle. These angles will hereinafter be called "line angles". When the operation depicted in FIG. 6 is performed, stresses applied to the metal layer and plastic layer of FMCL 1 have a vertical direction relative to the blade 2 (the direction a in FIG. 6), so that the direction in which the metal layer is caused to undergo a compression plastic deformation is also the direction a in FIG. 6. Since the compression plastic deformation produced in the direction a in FIG. 6 can be resolved into the machine direction b and transverse direction c of FMCL 1, the dimensional difference that the metal layer is longer than the plastic layer is reduced in both the machine direction and transverse direction.

Figure 7:
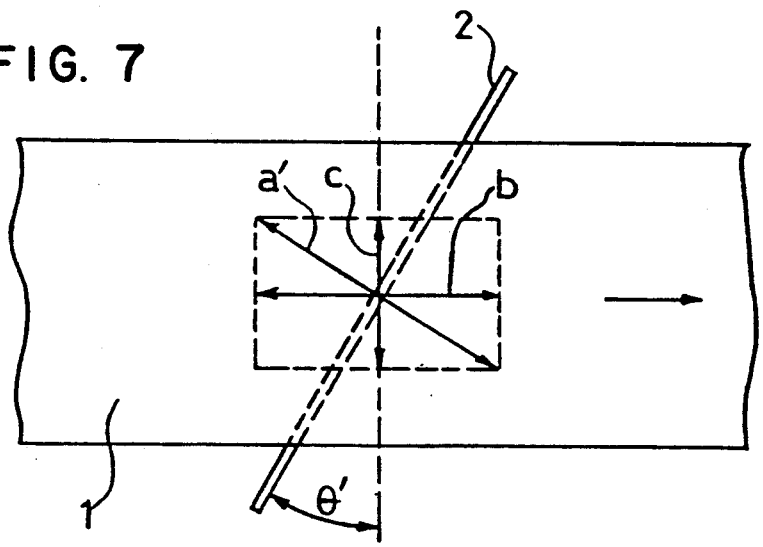

Such a single operation is however incapable of developing a stress in a direction parallel to the blade 2, so that the dimensional difference in that direction cannot be reduced. Dimensional differences in all directions can therefore be reduced by conducting the operation shown in FIG. 7 subsequent to the operation of FIG. 6. Namely, when the line angle θ is positive in the operation of FIG. 6, the blade is arranged to give a negative value to the line angle θ' in the operation of FIG. 7 and a stress is then applied to FMCL 1. When the line angle θ is negative, a stress is applied to FMCL 1 while setting the blade in such a way that the line angle θ' has a positive value. In this manner, the metal layer is caused to undergo a compression plastic deformation, thereby making it possible to reduce in each direction the dimensional difference that the metal layer is longer compared to the plastic layer. It is possible to control the direction and degree of reduction of the dimensional difference by controlling the degree of compression plastic deformation of the metal layer in each of the direction a in FIG. 6 and the direction b in FIG. 7.

Figure 8:
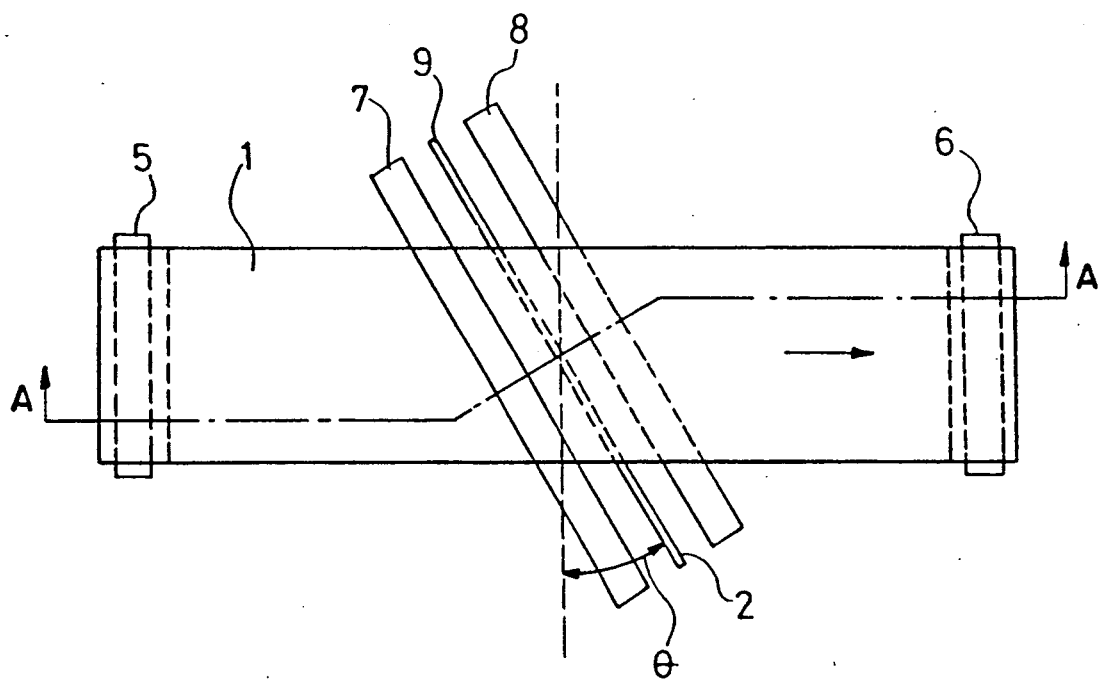
FIG. 8(1) is a schematic plan view showing a situation in which FMCL is continually bent at a line angle, and FIG. 8(2) is a vertical cross-section along line A—A in FIG. 8(1) of the situation.
Figure 8:
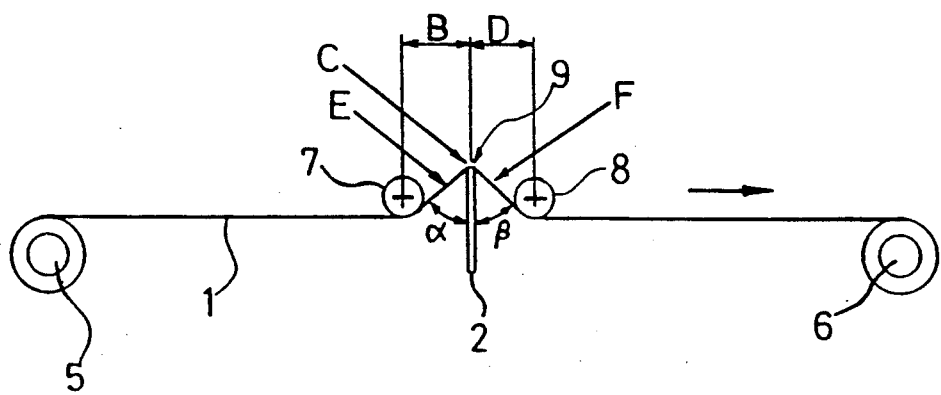

In order to reduce the above-described technical concept to practice, it is preferable to rely upon the following method. FIGS. 8(1) and 8(2) are schematic illustrations of an apparatus for actually applying a stress to FMCL 1 so as to reduce a dimensional difference that the metal layer is longer compared to the plastic layer, in which FIG. 8(1) is a top plan view whereas FIG. 8(2) is a vertical cross-section along line A—A in FIG. 8(1). Namely, until FMCL 1 paid out from a roll 5 is taken up on a roll 6, the metal layer is bent on the blade 2 while maintained in contact with the blade 2 so that the metal layer is caused to undergo a compression plastic deformation to a degree of at least 0.01% but not greater than 5%. By conducting this operation, it is possible to effectively reduce the dimensional difference that the metal layer is longer compared to the plastic layer.

Incidentally, rolls 7,8 are provided respectively before and after the blade 2 in FIGS. 8(1) and 8(2). These rolls 7,8 are arranged to ensure that FMCL 1 has suitable guide-in angle $\alpha$ and guide-out angle $\beta$ at every point on the blade 2. Preferably, the rolls 7,8 are provided in parallel with the blade 2. Although no particular limitation is imposed on the guide-in angle $\alpha$ and guide-out angle $\beta$, they may both preferably be at least 10 degrees but not greater than 89 degrees in order to attain the advantageous effects of this invention.

In order to ensure the compression plastic deformation of the metal layer upon performing the operation illustrated in FIG. 5 or FIG. 8, it is essential that FMCL 1 is continually bent on the blade 2 along the edge of the blade and is also allowed to pass by the edge against resistance from the edge. For this purpose, FMCL is caused to travel while applying a tension to it by a conventional moving means, for example, by using a take-up machine or take-up roller. According to a result of a detailed study by the present inventors, this tension may preferably be at least 10 g/cm but at most 10 kg/cm with at least 200 g/cm being more preferred in many instances although no particular range can be mentioned sweepingly as it is dependent on the thickness, modulus of elasticity, etc. of each metal layer. When a rolled copper foil of 35 $\mu$m thick is used by way of example, the desirable tension may range from 200 g/cm to 1,000 g/cm. This tension is applied by controlling a drive apparatus for the take-up machine, for example, by either increasing or decreasing the torque of an electric motor, or by providing a take-up roller before the take-up machine and controlling its drive torque.

Although no particular limitation is imposed on the speed at which FMCL 1 is continually bent on the blade 2 in FIGS. 8(1) and 8(2), it is preferable to perform the bending at a speed of from 0.2 m/min to 500 m/min from the industrial standpoint.

In FIG. 8(1), the line angle $\theta$ may range from $-80°$ to $+80°$ with a range of from $-60°$ to $+60°$ being preferred.

In FIGS. 8(1) and 8(2), it is preferable to subject the metal layer to compression plastic deformation at a temperature of at least 0° C. but not higher than 200° C.

Compression plastic deformation of the metal layer in all directions is feasible by applying a stress by a device as shown in FIG. 9 after the operation of FIGS. 8(1) and 8(2). Namely, a similar operation as in FIGS. 8(1) and 8(2) except for a line angle $\theta'$ is conducted. Preferably, the line angle $\theta'$ in FIG. 9 is negative when the line angle $\theta$ in FIG. 8(1) is positive but is positive when the line angle $\theta$ in FIG. 8(1) is negative. When the operation is performed several times, positive line angle and negative line angle may be alternated in such a way that a negative line angle is chosen after a positive angle, the positive angle is chosen again after the negative angle, and so on. As an alternative, the operation may be repeated a few times at a positive line angle and then repeated a few times further at a negative angle.

By conducting each of the operations shown respectively in FIGS. 8(1) and 8(2) and FIG. 9 at least once in accordance with this invention and causing the metal layer to undergo a compression plastic deformation to an extent of from 0.01% to 5%, the dimensional difference between the metal layer and plastic layer can be reduced thereby making it possible to obtain FMCL which has a dimensional difference of $\pm 0.3\%$ between its metal layer and plastic layer and which is suitable for use in usual applications. When the dimensional difference between the metal layer and plastic layer of FMCL that the metal layer is longer is reduced by conducting the operation of this invention, curling can also be reduced at the same time if FMCL is curled with the metal layer inside before the processing.

In the metal layer of FMCL in which the metal layer has been caused to undergo a compression plastic deformation by the operations illustrated in FIGS. 8(1) and 8(2) and FIG. 9 respectively, small dimensional variations may exist in the thicknesswise direction as a result of its bending. In such a case, it is preferable to perform the operation shown in FIGS. 8(1) and 8(2) in such a way that FMCL 1 is bent with the plastic layer maintained in contact with the blade 2. This operation applies a slight stress to the metal layer, so that dimensional variations in the thickness direction of the metal layer are reduced.

In this invention, various plastic materials and metal materials are usable depending on the end application. For example, as illustrative heat-resistant plastics, there are polyimides, polyamide-imides, polyamides, polyethersulfones, polyether ether ketones, polyarylates, polyparabanic acid, polytetrafluoroethylene, polyethylene terephthalate, etc. They are often used as electrical and electronic materials. Copper, aluminum, nickel, brass and the like are frequently used as metal layers to be laminated. The plastic and metal are however not particularly limited thereto. On the other hand, illustrative examples of low dielectric-constant plastics may include resins such as polyfluoroethylenes, e.g., polytetrafluoroethylene, polyphenylene oxide, polyimides, polyether sulfones, polyethylene, polypropylene and polybutylene terephthalate. They are used primarily in electronic circuit substrates which feature a low dielectric loss. Copper and aluminum are frequently used as metal layers to be laminated. The plastic and metal are however not particularly limited thereto. Illustrative heat-sealable plastics are resins such as modified polyethylenes, modified polypropylenes, modified ethylene-vinyl acetate copolymers, etc. They are used primarily in packaging materials. Aluminum, gold and the like are frequently used as metal layers to be laminated. Of these applications, it is the field of electrical and electronic materials such as electronic circuit substrates that particularly requires only a small dimensional difference between a plastic layer and its associated metal layer in the direction of the plane of the FMCL. The advantageous effects of the present invention can still be brought about even if these metal layers are made of an alloy or composed of plural layers, so long as their flexural rigidity fall within the range specified above. Use of a copolymer, resin blend or resin alloy for the formation of these plastic layers, inclusion of an inorganic filler such as calcium, carbon fibers or ceramic, an inorganic filler such as polytetrafluoroethylene and/or one or more of various plasticizers and formation of these plastic layers by plural layers can still bring about the advantageous effects of the present invention provided that the plastic layers satisfactorily fall within the above flexural rigidity range, and are hence embraced within the scope of this invention. Although no particular limitation is imposed on the lamination method useful in this invention for the production of FMCL, it is possible, for example, to cast a solution of a plastic or its precursor in a solvent on a metal layer and then to heat the solution to form a plastic layer on the metal layer; to form a plastic layer on a metal layer by melt extrusion; to laminate under heat adhesive-coated plastic layer and metal layer; to form a metal layer on a plastic layer by sputtering or vacuum evaporation; to form a metal layer on a plastic layer by electroless plating; or to form an additional metal layer, which has been formed on the metal layer by any one of the above methods, so as to provide a still thicker metal layer. It is also preferable to subject the metal layer or plastic layer to a surface treatment with an inorganic material and/or organic material so as to enhance the adhesion between the metal layer and plastic layer which form FMCL.

In FMCL to which the present invention is directed, it is preferable that the flexural rigidity of the metal layer is 20 g.cm or smaller and the flexural rigidity of the plastic layer is at least 1/500 of that of the metal layer. Here, flexural rigidity is defined by the following equation.

$$D = Et^3/\{12(1-v^2)\}$$

wherein,
D: flexural rigidity (g.cm)
E: Young's modulus (g.cm$^2$)
t: thickness (cm)
v: Poisson's ratio (—)

The metal useful in the practice of this invention generally undergoes a plastic deformation under a stress, whereas the plastic employed in the present invention has viscoelastic properties. It is therefore difficult to measure their Young's moduli precisely. In this invention, flexural rigidity is therefore specified in accordance with the above-described flexural rigidity equation, using a so-called apparent Young's moduli under a stress of at least 1 kg/mm$^2$ which is determined, for example, by conducting a tensile test of a metal layer or plastic layer alone at a predetermined pulling speed on a tensile testing machine and then relying upon a load-displacement chart or by measuring strain by a strain gauge.

The metal layer may be formed of plural metal layers or may be made of an alloy so long its flexural rigidity does not exceed 20 g.cm. The preferable thickness of the metal layer may range from 0.05 μm to 100 μm. On the other hand, the plastic layer may be formed of plural plastic layers so long as its flexural rigidity is at least 1/500 of that of the metal layer. The thickness of the plastic layer may generally range from 1 μm to 200 μm.

The dimensional difference between the metal layer and plastic layer forming FMCL can be determined in the following manner. Since the rigidity of a metal is sufficiently greater than a plastic, the plastic layer can be said to be elastically deformed by the metal layer in FMCL in which there is a dimensional difference between the metal layer and plastic layer. Upon removal of the metal layer from FMCL under conditions free of stress by etching or the like, the plastic layer is allowed to undergo an elastic deformation to restore its original shape so that the original dimensions of the plastic layer itself can be determined. The relative dimensional difference between the metal layer and plastic layer (the percentage of shrinkage of the plastic layer) can thus be expressed by the following equation in this invention.

$$\begin{aligned}\text{Dimensional difference between metal layer and plastic layer} &= \text{Percentage of shrinkage of plastic layer after etching} \\ &= \frac{\left(\begin{array}{c}\text{Dimension}\\\text{before etching}\end{array}\right) - \left(\begin{array}{c}\text{Dimension}\\\text{after etching}\end{array}\right)}{(\text{Dimension before etching})} \times 100\,(\%)\end{aligned}$$

Incidentally, the degree of the compression plastic deformation of the metal layer caused as a result of its bending on the blade is expressed as follows.

Percentage of plastic deformation of metal =

$$\frac{\left(\begin{array}{c}\text{FMCL dimension}\\\text{before bending}\end{array}\right) - \left(\begin{array}{c}\text{FMCL dimension}\\\text{after bending}\end{array}\right)}{(\text{FMCL dimension before bending})} \times 100\,(\%)$$

In this invention, the blade to which FMCL is brought into contact may preferably have, at the FMCL-contacting edge thereof, linearity of accuracy within ±1 mm in the transverse and/or vertical direction. The term "linearity" as used herein means that the FMCL-contacting portion has linearity of the above-specific accuracy in the up-to-down direction and vice versa and/or the front-to-rear direction and vice versa. This accuracy may preferably be within ±0.2 mm with ±0.05 mm being particularly preferred. Although the accuracy is ideally ±0.0 mm of course, it is practically impossible to achieve it due to the accuracy of working. The blade is slightly deformed in the travelling direction of FMCL due to the tension of FMCL while the compression plastic deformation of this invention is caused to occur. Preferably, this deformation should also be within 1 mm.

If the accuracy of linearity falls below ±1 mm, namely, the deviation from a straight line is greater than ±1 mm, the contact between FMCL and the blade may probably become uneven on the order of microns so that the reduction of the dimensional difference may not be achieved uniformly. Where there are a more convex portion and a more concave portion in a single piece of blade, an FMCL portion contacted to the convex portion has a greater relative plastic deformation while another FMCL portion contacted to the concave portion has a smaller relative plastic deformation. The degree of compression plastic deformation therefore varies within the same FMCL, thereby developing localized ruggedness or surge which should not occur if the degree of plastic deformation were uniform. In a certain extreme case, puckering or creases which lock like streaks in the travelling direction may occur in FMCL after its processing.

The width of FMCL is generally about 500 mm or so. When FMCL has a width of 500 mm and the blade is arranged at the line angle of 45°, the FMCL-contacting portion of the blade is 708 mm long. At the line angle of 80°, the length increases to 2879 mm. It is by no means feasible to determine the linearity of a blade of such a length, in other words, to determine whether ruggedness of ±1 mm exists over a length of 500 mm or more so long as the measurement is performed visually relying upon a square or the like. In general, the measurement is feasible only when a three-dimensional measuring instrument whose measurable limit is on the order of ±10 mm is used. In addition, linearity including variations in cross-sectional shape can be measured by enlarging the cross-section at each point in the longitudinal direction by means of a magnifying projector or the like. As has been discovered for the first time by the present inventors, totally unexpected differences in action take place regarding the uniformity of a compression plastic deformation, effects for reducing an interlayer dimensional difference, existence of non-existence of puckering, etc., depending on linearity deviations of an order as small as about $\theta 1$ mm or so, preferably, within about $\theta 0.2$ mm, namely, of such a degree as not recognizable visually. This should be extremely surprising.

A blade may have such a shape that the curvature of radius of an edge portion, to which FMCL is brought into contact, as seen in a longitudinal cross-section thereof is smaller than 0.5 mm but greater than 0.001 mm, namely, greater than substantially zero radius of curvature. An radius of edge curvature of 0.5 mm or greater can apply a flexural plastic deformation to a metal layer but cannot apply any compression plastic deformation to the metal layer, so that the dimensional difference cannot be reduced.

Any blade shape may be employed so long as the radius of edge curvature falls within the above range. Blades of various shapes may thus be used, including those having a trapezoidal, circular, oval, rectangular or similar vertical cross-section as viewed in the travelling direction of FMCL.

Several examples of such a vertical cross-sectional blade shape are shown in FIGS. 10(a) to 10(i).

As depicted in the drawing, one or more FMCL-contacting edges may be provided.

The material of the blade may be a metal, for example, iron steel, stainless steel, titanium, a titanium alloy or another alloy, a ceramic such as zirconia, glass or a composite material thereof. No particular limitation is imposed thereon.

It is preferable to provide a guide right before and/or right after and in close proximity with the blade edge, for example, in order to control the dimensional difference between the metal layer and plastic layer of FMCL or the contact pressure of FMCL to the blade, to control the guide-in angle or guide-out angle between the blade and FMCL, or to control the tension to be exerted to FMCL upon its passage by the blade edge.

FIG. 11(1) is a schematic plan view to be referred to upon description of the method and apparatus of this invention, while FIG. 11(2) is a vertical cross-section of the apparatus.

After FMCL 1 has advanced in a direction indicated by arrows and has then passed by the guide 10 while maintained in contact with the lower surface of the guide 0, FMCL 1 passes over the edge portion 9 of the blade 2. FMCL 1 thereafter passes by the guide 11 while being maintained in contact with a lower surface of the blade 2, whereby processing by the blade 2 is completed.

The lower end faces of the guides 10,11 to which the upper side of FMCL 1 is brought into contact, may preferably be in parallel with the edge portion 9 of the blade 2 [see FIG. 11(1)] and define a contact surface having good linearity like the edge portion 9. The radius of curvature of the contact surface of each guide may preferably be at least 1 mm with a range of from about 5 mm to about 100 mm or so being particularly preferred for ensuring the effects of the processing.

The parallelism between the edge portion of the blade and each guide may preferably be within $\theta 1$ mm, more preferably, $\theta 0.2$ mm over the entire lengths of their portions to which FMCL is brought into contact.

Each of the distances B and D in FIG. 11(2) may preferably be 300 mm or shorter with 100 mm or shorter being particularly preferred.

The lower limit of each of the distances B and D falls within a range that the blade is not in contact with the corresponding guide. The lower limit may be any value so long as FMCL is allowed to pass therebetween. A distance as small as 0.1 mm still permits the passage of FMCL.

Although the guides 10 and 11 are at the same level in FIG. 11(2) they may be provided at different levels.

For the continuous processing of FMCL, let-off machine and winding machine or guide rolls are arranged both before and after the blade respectively. If the guides according to this invention are not provided, the angle between the blade and FMCL varies along the width of FMCL as indicated by $\alpha,\alpha'$ in FIGS. 12(1) and 12(2). As a result, the effects of the blade are not applied equally, so that the interlayer dimensional difference cannot be reduced substantially to zero and puckering, ruggedness and meandering occur due to the uneven effects, thereby failing to obtain good FMCL. As a result of continued trial-and-error efforts against this very difficult obstacle, it was found surprisingly that unexpectedly good results of a uniform reduction of the dimensional difference over the entire surface of FMCL can be obtained when guides are provided at positions both before and after and in close proximity of the blade and in parallel with the blade edge and $\alpha,\alpha'$ are set constant relative to FMCL and equal to each other, thereby leading to completion of the apparatus according to this invention.

It is preferable to provide a guide roller right before and/or right after, in close proximity with and in parallel with the blade edge in this invention so as to achieve effective reduction of the interlayer dimensional difference between the metal layer and plastic layer, fine adjustment of contact pressure of FMCL to the blade, adjustment of the tension applied to to FMCL upon its passage by the blade edge, etc.

FIG. 8(1) is a schematic plan view illustrating method and apparatus according to this invention, while FIG. 8(2) is a vertical cross-section of the apparatus.

FMCL 1 advances in the direction indicated by the arrow. After passing by the guide roller 7 while being kept in contact with the lower face thereof, FMCL passes by the edge portion 9 of the blade 2. Thereafter, FMCL passes by the guide roller 8 while being maintained in contact with the lower face of guide roller 8, whereby processing by the blade 2 has been completed.

The lower end faces of the guide rollers 7,8, to which the upper side of FMCL 1 is brought into contact, may preferably be in parallel with the edge portion 9 of the blade 2 and define a contact face having good linearity like the edge portion 9. The radius of curvature of the contact surface of each guide roller may preferably be at least 1 mm with a range of from about 5 mm to about 100 mm or so being particularly preferred for the improvement of the effects of the processing. The parallelism between the blade and each guide roller may preferably be within $\theta 1$ mm, more preferably, $\theta 0.2$ mm over the entire lengths of their portions to which FMCL is brought into contact. The parallelism should be 0 mm ideally.

Each of the distances B and D in FIG. 8(2) may preferably be 300 mm or shorter with 100 mm or shorter being particularly preferred. The lower limit of each of the distances falls within a range that the blade is not in contact with the corresponding guide roller. The lower limit may be any value so long as FMCL is allowed to pass therebetween. A distance as small as 0.1 mm is still permissible.

As the material forming the entirety of each guide roller or its outer peripheral surface, it is possible to use any one of various materials such as metals, e.g., iron steel, stainless steel, titanium alloys or aluminum alloys, ceramics, glass, engineering plastics; or a composite material thereof.

Although the guide rollers 7 and 8 are at the same level in FIG. 8(2), they may be provided at different levels.

Effects, which may be brought about from the use of rolls as guides, will next be described.

When FMCL is caused to pass under tension while being maintained in contact with the blade, a friction occurs between the blade and FMCL. In order to reduce the interlayer dimensional difference or curling in all directions of FMCL, the blade is arranged at the forementioned angle with respect to the transverse direction of FMCL. In this case, a thrust is produced along the blade due to the friction between FMCL and the blade.

Figure 13:
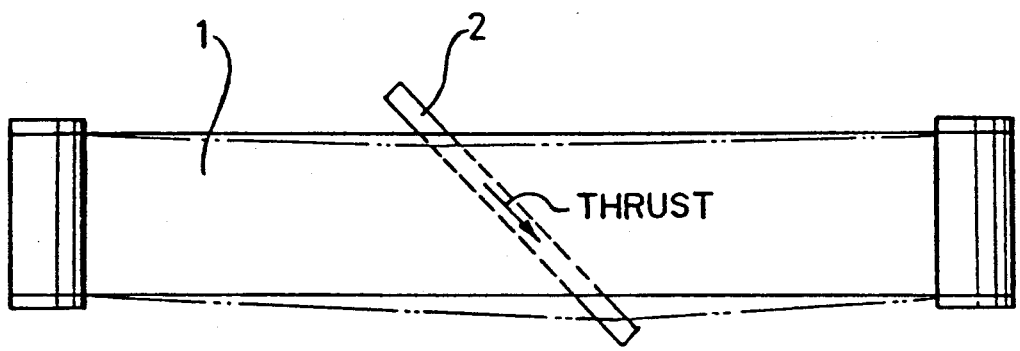
FIG. 13 is a schematic illustration showing that FMCL on a blade is meandering due to a thrust.

The present inventors have found that the omission of the guide rollers according to this invention results in movements of FMCL in the transverse direction due to the thrust and puckering hence occurs on FMCL and in a severer case, the meandering becomes great and FMCL leaves the blade to render the operation no longer feasible (see FIG. 13).

Figure 14:
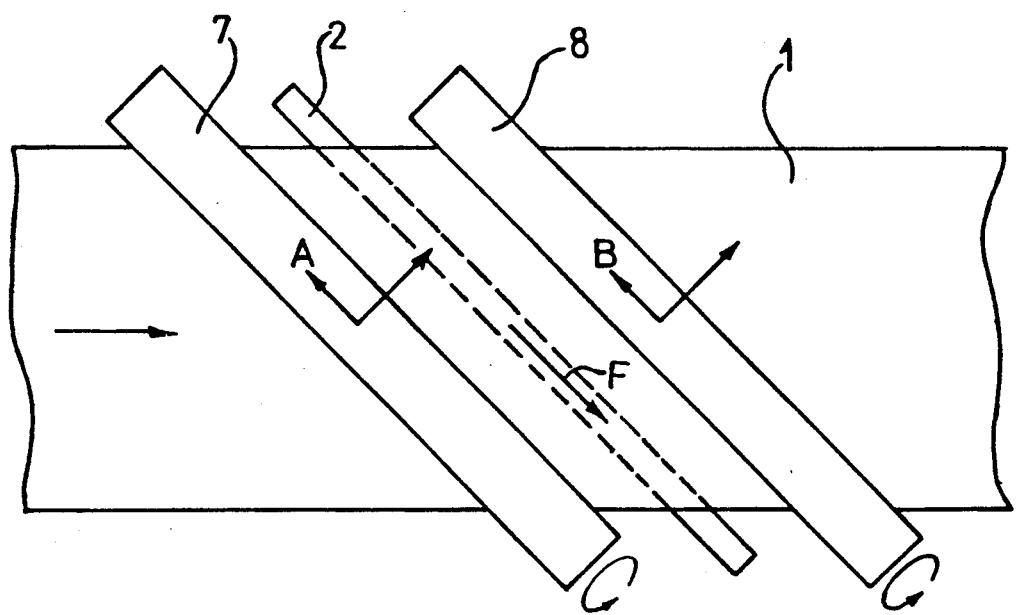
FIG. 14 is a schematic illustration of a thrust by a blade and another thrust by each guide roller.

On the other hand, as illustrated in FIG. 14, sideward thrusts can be produced in directions opposite to the above-described thrusts at the edges, namely, as indicated by arrows A and B by rotating the guide rollers. Namely, by controlling the revolutional speed of the guide rollers to a desired speed such that the combined thrust of those indicated by arrows A and B may cancel the thrust caused by the friction between the blade and edge portion and indicated by arrow F, the extent of meandering of travelling FMCL can be reduced or completely avoided.

The speed of the outer peripheral surface of each of the guide rollers 7,8 varies depending on the material of the surface of the roller and that of the surface of FMCL, which is brought into contact with the roller. No particular limitation is hence imposed thereon. According to an investigation by the present inventors, it is however preferable from the standpoint of process control to control the speed to a level not higher than the speed equal to the travelling speed of FMCL, namely, not higher than the speed at which the outer peripheral speed of the roller is equal to the travelling speed of FMCL and not higher than the speed at which the roller undergoes free rotation, so that the thrusts are caused to cancel each other to prevent meandering. Although the speed also varies depending on the thickness of FMCL and its guide-in and guide-out angles, an optimum speed can be chosen empirically with ease from the above-described range.

The lower limit of the desirable speed may include a speed substantially equal to standstill. Good results may be obtained at a speed close to standstill, although this depends on the kind of FMCL.

Figure 12:
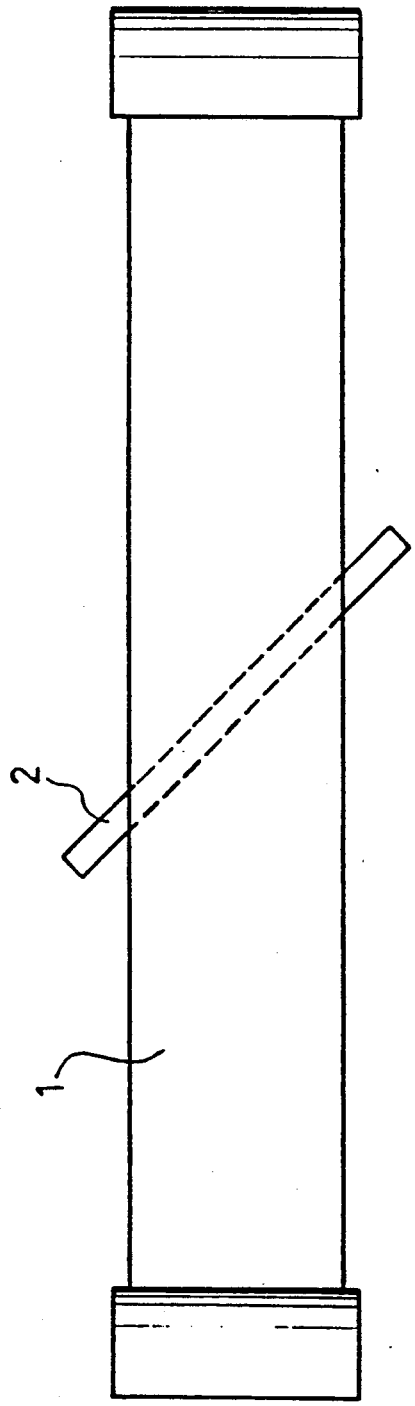
FIGS. 12(1) and 12(2) schematically show that the angle between a blade and FMCL varies when a guide or guide roller useful in the practice of this invention is omitted.
Figure 12:
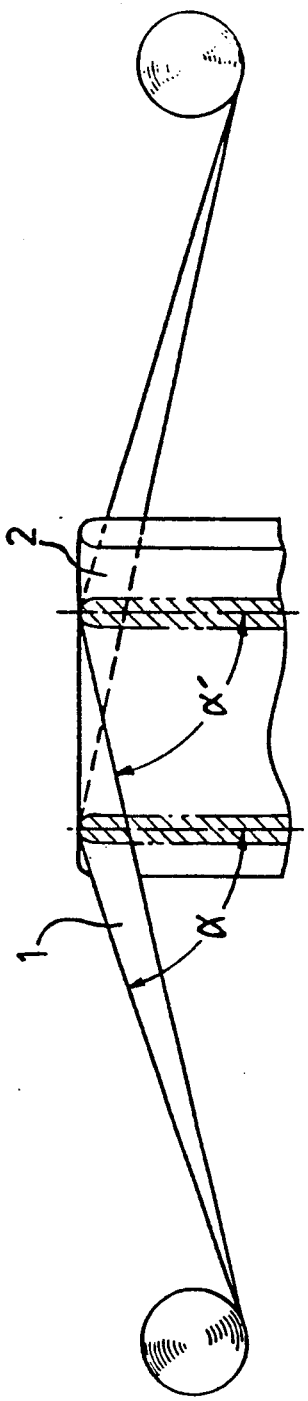

In addition to the above-described effects, primarily, the meandering-preventing effects, the guide rollers can also have the same function as the principal function of the aforementioned guides provided before and after the blade that $\alpha$ and $\alpha'$ in FIG. 12 are set equal to each other.

Owing the the effects described above, FMCL does not undergo meandering and is allowed to run stably thereby making it possible to obtain FMCL in which the dimensional difference is reduced evenly at all portions on the entire area of FMCL.

Specific embodiments of the present invention will hereinafter be described by the following Examples. They are however merely of illustrative and should not be construed as limiting the scope of this invention.

EXAMPLE 1

A commercial polyamidic acid varnish ("Eupilex A", trade name; product of Ube Industries, Ltd.) was cast evenly on an elongated commercial electrolytic copper layer ("3EC-III", trade name; product of Mitsui Mining & Smelting Co., Ltd.), followed by drying under heat at 120° C. for 5 minutes and further at 180° C. for 6 minutes. The same polyamidic acid varnish was thereafter cast again on the coated surface to such an extent that the flexural rigidity of a polyimide film, which was to be formed subsequent to imidation, would be 0.1 g.cm or so. The latter varnish was dried under heat at 120° C. for 5 minutes and further at 180° C. for 6 minutes. The resultant product was finally heated for 20 minutes in a nitrogen atmosphere of 330° C. having an oxygen concentration of 0.5%, thereby obtaining an elongated FMCL having the polyimide bonded directly to the copper layer. The thickness of the polyimide was 30 $\mu$m at that time.

The FMCL was then slit with a 500 mm wide and then taken up on a winding roll.

Figure 15:
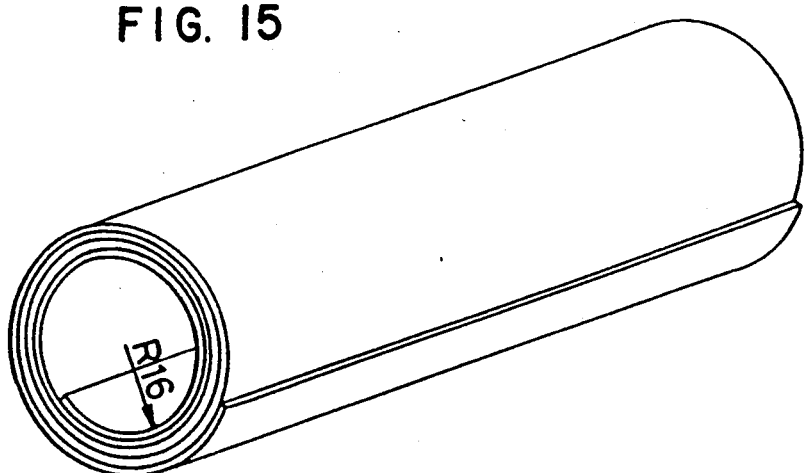
FIG. 15 is a schematic illustration showing FMCL in a curled state.

When the FMCL was cut out in the form of a square of 200 mm $\times$ 200 mm, curling having a radius of curvature of about 16 mm was developed with the polyimide inside as shown in FIG. 15.

Figure 16:
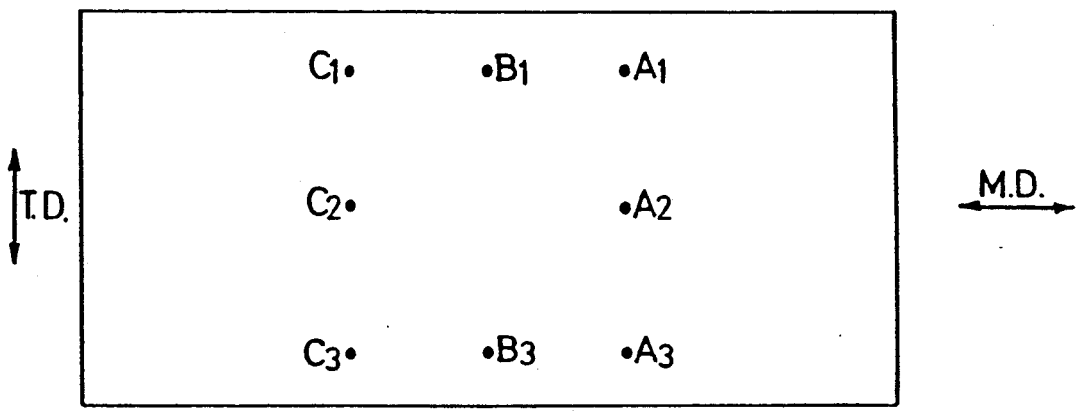
FIG. 16 is a plan view showing the arrangement of reference points upon measurement of the dimensions of laminates in Examples and Comparative Examples.

A 600 mm long sample was cut out from the FMCL and marks were placed on the plastic layer as shown in FIG. 16. The distances between the marks $A_1$-$C_1$, $A_2$-$C_2$, $A_3$-$C_3$, $A_1$-$A_3$, $B_1$-$B_3$ and $C_1$-$C_3$ were 300.00 mm respectively.

Next, after subjecting the FMCL to an etching treatment and hence removing the copper layer, the above distances were measured again. Results are shown in the following table. Incidentally, the thickness of the polyimide layer after the removal of the copper layer was 30 $\mu$m. In the following table, MD indicates the advancing direction of the FMCL while TD designates its transverse direction.

|    |            | Distance after etching (mm) | Dimensional difference between copper layer and plastic layer (%) |
|----|------------|------------------------------|------------------------------------------------------------------|
| MD | $A_1$-$C_1$ | 298.41 | 0.53 |
|    | $A_2$-$C_2$ | 298.29 | 0.57 |
|    | $A_3$-$C_3$ | 298.38 | 0.54 |
| TD | $A_1$-$A_3$ | 298.41 | 0.53 |
|    | $B_1$-$B_3$ | 298.32 | 0.56 |
|    | $C_1$-$C_3$ | 298.38 | 0.54 |

As described above, the dimension of the polyimide layer was shorter by 0.53-0.57% than that of the copper layer.

The flexural rigidity of the copper layer employed in this Example after the heating step of the lamination procedure was 1.45 g.cm (thickness: 35 μm; Young's apparent modulus under 3 kg/mm² tensile stress; 3600 kg/mm² at 25θ and 5 mm/min pulling rate), namely, smaller than 20 g.cm.

Upon measurement of the polyimide film obtained above, its flexural rigidity was 0.097 g.cm (thickness: 30 μm; Young's apparent modulus under 1.5 kg/mm² tensile stress: 380 kg/mm² at 25θ and 5 mm/min pulling rate), namely, about 1/15 of the flexural rigidity of the copper layer and hence greater than 1/500 of the flexural rigidity of the copper. The plastic layer was marked to set the distances between the marks $A_1$-$C_1$, $A_2$-$C_2$, $A_3$-$C_3$, $A_1$-$A_3$, $B_1$-$B_3$ and $C_1$-$C_3$ at 300.00 mm respectively.

Using a titanium alloy blade whose shape was as shown in FIG. 10(b) and whose edge portion had a radius of curvature of 0.2 mm, the FMCL was then continuously bent once at each of line angles of +40° and −40° while maintaining the guide-in and guide-out angles at 50°, and then once at each of line angles of +40° and −40° while maintaining the guide-in and guide-out angles at 30°, namely, 4 times in total while applying a tension of 0.5 kg/cm and maintaining the copper layer in contact with the blade, thereby obtaining an FMCL whose copper layer had been subjected to compression plastic deformation.

Although the thus-processed FMCL had mild curling of about 400 mm or so in terms of radius of curvature with the copper layer located inside, it was substantially planar.

The above-marked portion of the FMCL whose dimensional difference reducing processing had been completed was cut out and the individual distances were measured. The following results were obtained.

|    |            | Distance after processing (mm) | Percentage of plastic deformation of the copper layer |
|----|------------|-------------------------------|-------------------------------------------------------|
| MD | $A_1$-$C_1$ | 298.68 | 0.44 |
|    | $A_2$-$C_2$ | 298.60 | 0.47 |
|    | $A_3$-$C_3$ | 298.64 | 0.45 |
| TD | $A_1$-$A_3$ | 298.58 | 0.47 |
|    | $B_1$-$B_3$ | 298.63 | 0.46 |
|    | $C_1$-$C_3$ | 298.65 | 0.45 |

As is apparent from the above measurement results, the copper layer underwent a compression plastic deformation and the dimension as FMCL shrunk by 0.44-0.47%. The resultant product is FMCL of this invention in which the copper layer as a metal layer has been subjected to compression plastic deformation.

Next, in order to measure the dimensional difference between the copper layer and plastic layer of the FMCL according to this invention, the FMCL was subjected to an etching treatment to remove the copper layer. Thereafter, the distances were measured again. The following results were obtained.

|    |            | Distance after etching (mm) | Dimensional difference between copper layer and plastic layer (%) |
|----|------------|------------------------------|------------------------------------------------------------------|
| MD | $A_1$-$C_1$ | 298.41 | 0.09 |
|    | $A_2$-$C_2$ | 298.35 | 0.08 |
|    | $A_3$-$C_3$ | 298.40 | 0.08 |
| TD | $A_1$-$A_3$ | 298.36 | 0.07 |
|    | $B_1$-$B_3$ | 298.38 | 0.08 |
|    | $C_1$-$C_3$ | 298.40 | 0.08 |

As is apparent from the measurement results, excellent FMCL in which the copper layer as a metal layer had been subjected to compression plastic deformation and the dimensional difference between the copper layer and polyimide layer is within 0.1% was successfully obtained in accordance with this invention.

A fine patterned circuit was formed using the FMCL of this invention. It was possible to obtain an extremely good flexible printed circuit free of puckering, waving, ruggedness or the like.

Comparative Example 1

Figure 17:
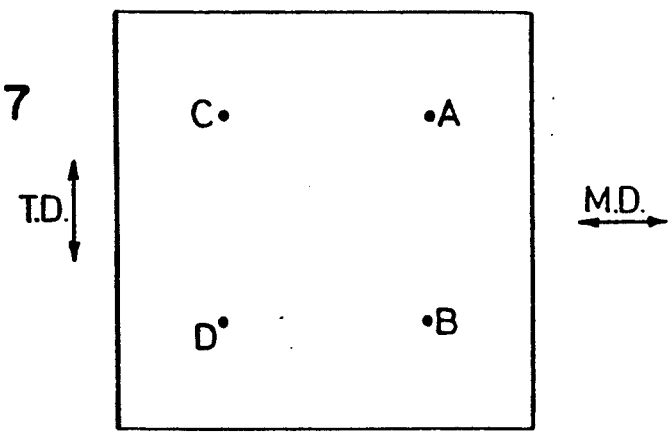
FIG. 17 is a plan view showing the arrangement of reference points upon measurement of dimensions in Comparative Example 1.

An FMCL sample of 200 mm×200 mm was cut out from the untreated FMCL which had been obtained in Example 1 and had not been subjected to compression plastic deformation. Marks were placed on the sample as shown in FIG. 17 in such a way that the distances of A-C, B-D, A-B and C-D were each 100.00 mm. With a view toward stretching the polyimide layer of the FMCL, the FMCL was held at both MD end portions thereof at room temperature and while applying a force of 100 kgf uniformly, the FMCL was maintained for 1 minute. Thereafter, the FMCL was held at both TD end portions and while applying a force of 100 kgf uniformly, the FMCL was maintained for 1 minute. When the FMCL was taken out of the stretching machine, the FMCL contained pencil-like curves having a radius of curvature of 3 mm or smaller so that the curling had been aggravated.

Upon measurement of the dimension of the FMCL, the following results were obtained.

|    |       | Distance after etching (mm) | Percent of stretch* of FMCL (%) |
|----|-------|------------------------------|----------------------------------|
| MD | A-C   | 100.62 | 0.62 |
|    | B-C   | 100.68 | 0.68 |
| TD | A-B   | 100.67 | 0.67 |
|    | C-D   | 100.65 | 0.65 |

*Expressed by:

$$\frac{\left(\begin{array}{c}\text{Dimension after}\\\text{stretching}\end{array}\right) - \left(\begin{array}{c}\text{Dimension before}\\\text{stretching}\end{array}\right)}{\text{Dimension before stretching}} \times 100$$

Next, the FMCL was subjected to an etching treatment to remove the copper layer and the above distances were measured again. Results are summarized in the following table.

|    |     | Distance after etching (mm) | Dimensional difference between copper layer and plastic layer (%) |
|----|-----|------------------------------|--------------------------------------------------------------------|
| MD | A-C | 99.48 | 1.13 |
|    | B-D | 99.53 | 1.14 |
| TD | A-B | 99.52 | 1.14 |
|    | C-D | 99.50 | 1.14 |

Namely, the dimensional difference between the copper layer and polyimide layer was increased on the contrary instead of being reduced.

Comparative Example 2

On an electrolytic copper foil which was of the same kind as that employed in Example and had the same flexural rigidity of 1.45.cm (thickness: 35 μm; Young's apparent modulus under 3 kg/mm² tensile stress: 3600 kg/mm² at 25° C. and 5 mm/min pulling rate), the polyamidic acid varnish of Example 1 was cast to such an extent that the flexural rigidity of a polyimide layer to be formed subsequent to imidation would reach $2.6 \times 10^{-3}$ g.cm.

The varnish was imidated under the same heating conditions as in Example 1, thereby obtaining an FMCL which was composed of a copper layer and a polyimide layer.

A sample was cut out form the FMCL and was then subjected to etching to obtain the polyimide layer. Upon measurement of the polyimide layer, its flexural rigidity was found to be $2.63 \times 10^{-3}$ g.cm, which was about 1/551 of the flexural rigidity of the copper layer (thickness: 9 μm; Young's apparent modulus under 1.5 kg/mm² tensile stress: 380 kg/mm² at 25θ and 5 mm/min pulling rate).

A 600 mm long sample was cut out from the FMCL and the dimensional difference between the copper layer and polyimide layer was measured in the same manner as in Example 1. It was found to range from 0.53% to 0.57%.

The FMCL was subjected to the same interlayer dimensional difference reducing processing as in Example 1. The thus-processed FMCL had mild curling with the copper layer located inside.

The dimensional difference between both the layers in each of machine and transverse directions was measured in the same manner as described above. It was found to range from 0.52% to 0.59%, so that no reduction had taken place in the dimensional difference. It was hence confirmed that the copper layer as the metal layer of the FMCL had undergone substantially no compression plastic deformation.

The FMCL was then subjected to second interlayer dimensional difference reducing processing in the same manner as in Example 1. The interlayer dimensional difference was measured by the same measuring method as that described above. The difference was found to range from 0.53 to 0.58% and no reduction has yet occurred in the dimensional difference.

Using this FMCL, a wiring pattern was drawn by a usual method known per se in the art to fabricate a flexible printed circuit. Ruggedness and puckering occurred, thereby failing to provide an acceptable flexible printed circuit.

Comparative Example 3

On a stainless steel foil having a flexural rigidity of 61.6 g.cm (thickness: 70 μm; Young's modulus: 19600 l kg/mm²), the polyamidic acid varnish of Example 1 was cast to such an extent that the flexural rigidity of a polyimide layer to be formed subsequent to imidation would reach 0.7 g.cm.

The varnish was imidated under the same heating conditions as in Example 1, thereby obtaining an FMCL which was composed of the stainless steel layer and polyimide layer.

A sample was cut out form the FMCL and was then subjected to etching to obtain the polyimide film. Upon measurement of the polyimide film, its flexural rigidity was found to be 0.70 g.cm, which was about 1/187.5 of the flexural rigidity of the stainless layer (thickness: 58 μm; Young's apparent modulus under 1.5 kg/mm² tensile stress: 380 kg/mm² at 25θ and 5 mm/min pulling rate).

A 600 mm long sample was cut out from the FMCL and the dimensional difference between the stainless steel layer and polyimide layer was measured in the same manner as in Example 1. It was found to range from 0.53% to 0.58%.

The dimensional difference between both the layers in each of the machine and transverse directions of the FMCL after its processing was measured in the same manner as in that described in Example 1. It was found to range from 0.54% to 0.97%, so that no reduction had taken place in the dimensional difference. It was hence confirmed that the stainless steel layer as the metal layer of the FMCL had undergone substantially no compression plastic deformation.

Comparative Example 4

The unprocessed FMCL obtained in Example 1 was processed in the same manner as in Example 1 except for the use of a blade having an edge portion whose radius of curvature was 2.5 mm. As a result of the interlayer dimensional difference between the copper layer and plastic layer, it was found to be 0.55–0.6% in the machine direction and 0.53–0.56% in the transverse direction. The dimensional difference had hence not been reduced. It has been confirmed that the above processing cannot provide FMCL whose copper layer as a metal layer has been subjected to compression plastic deformation.

EXAMPLE 2

A polyamide-polyamidic acid block copolymer was obtained by the following procedures A, B and C.

A. Production of Polyamide Having Terminal Amino Groups

In a 1-l reactor fitted with a stirrer, an internal thermometer, a dropping funned equipped with a pressure equalizer, and an inlet tube, 6.84 g (0.0342 mole) of 4,4'-diaminodiphenyl ether was completely dissolved in 40 g of dry N,N-dimethylacetamide.

While cooling the internal temperature of the reactor at −5°–0° C. by means of a coolant jacket, a mixture of 2.46 g (0.0121 mole) of isophthalic acid dichloride in a solid form and 2.46 g (0.0121 mole) of terephthalic acid dichloride in a solid form was added little by little to the solution in a nitrogen atmosphere.

After completion of the addition, the viscous reaction mixture was heated to 10° C., at which it was stirred for 1 hour.

Next, a solution which had been prepared by diluting 3.09 (0.0532 mole) of propylene oxide with 6 g of dry N,N-dimethylacetamide was added dropwise while maintaining the temperature of the reaction mixture at 5°-10° C. After completion of the dropwise addition, the reaction mixture was stirred at 5°-10° C. for 1 hour to obtain a polyamide having terminal amino groups and a calculated average molecular weight of 1,000.

B. Production of Polyamidic Acid Having Acid Anhydride Terminals

In a similar reactor as in the procedure A, 27.1 g (0.124 mole) of pyromellitic dianhydride was suspended in 41 g of dry N,N-dimethylacetamide.

A solution which had been prepared by dissolving 22.9 g (0.124 mole) of 4,4'-diaminodiphenyl ether in 92 g of dry N,N-dimethylacetamide was added dropwise at 5°-20° C. in a nitrogen atmosphere.

The viscosity increased as the dropwise addition proceeded. In order to adjust the viscosity, 67 g of dry N,N-dimethylacetamide was added when 75% of the amine solution had been added.

After completion of the dropwise addition, the reaction mixture was stirred at 20°-25° C. for 1 hour to obtain polyamidic acid containing acid anhydride terminals and having a calculated average molecular weight of 5,000.

C. Production of Polyamide-polyamidic Acid Block Copolymer

A solution of the polyamide obtained by the procedure A and containing terminal amino groups was added at 15°-20° C. in a nitrogen atmosphere over about 30 minutes to a solution of the polyamidic acid obtained by the procedure B and containing acid anhydride terminals.

Further, 89 g of N,N-dimehtylacetamide was added, followed by stirring at 20°-25° C. for 2 hours.

A viscous solution was obtained, which contained 15.0 wt. % of a polyamide-polyamidic acid block copolymer having an intrinsic viscosity of 1.62 as measured at 35° C. in the form of a 0.5 g/100 ml N,N-dimethylacetamide solution.

A solution of the polyamide-polyamidic acid copolymer obtained by the procedure C was cast evenly on a rolled copper foil ("BHN-02", trade name; product of Nippon Mining Co., Ltd.; thickness: 35 µm). After drying the solution under heat at 150° C. for 20 minutes, it was heated further at 200° C. for 10 minutes and then at 300° C. for 10 minutes in a nitrogen atmosphere so that an FMCL having both a copper layer and a polyamide-imide layer was obtained.

The thickness of polyamide-imide layer of the thus-obtained FMCL was 35 µm. The dimensional difference between the copper layer and polyamide-imide layer was 0.54% in the machine direction and 0.52% in the transverse direction.

Incidentally, the flexural rigidity of the copper layer used in this Example after the heating step of the lamination procedure was 0.96 g.cm (thickness 35 µm; Young's modulus: 2400 kg/mm$^2$; testing method was the same as that used in Example 1). The flexural rigidity of the plastic layer was 0.30 g.cm (thickness 50 µm; Young's modulus: 250 kg/mm$^2$; testing method was the same as that used in Example 1).

The FMCL was continually bent under a tension of 500 g/cm at a speed of 3 m/min on a blade made of a carbon tool steel, having a thickness of 1.0 mm, equipped with an edge whose radius of curvature was 0.3 mm and coated with a ceramic, while maintaining the copper layer in contact with the edge portion of the blade. Here, the line angle was 30 degrees while the guide-in and guide-out angles were both 45 degrees. The FMCL was then continually bent by the same operation as the above operation except that the line angle was changed to −30 degrees. Next, the FMCL was continually bent by the same operation as the above operations except that the guide-in and guide-out angles were both changed to 40 degrees and the line angle was set at 30 degrees. Thereafter, the FMCL was continually bent by the same operation as the above operations except that the guide-in and guide-out angles were both set at 40 degrees and the line angle was changed to −30 degrees.

The percentage of compression plastic deformation of the copper layer in the FMCL obtained as described above was measured in the same manner as in Example 1. It was 0.46% in the machine direction and 0.44% in the transverse direction. It was hence confirmed that the FMCL was an FMCL according to this invention in which the copper layer had been subjected to compression plastic deformation. Further, the dimensional difference between the copper layer and polyamide-imide layer of the FMCL was 0.08% in both the machine and transverse directions. From this dimensional difference, the FMCL was also recognized to be a good FMCL whose copper layer had been subjected to compression plastic deformation.

EXAMPLE 3

The interlayer dimensional difference of a commercial FMCL ("ETCH-Å-FLEX", trade mark; product of Southwall Technologies Inc.), which had been obtained by laminating copper to 4 µm by a sputtering technique on a polyimide film having a thickness of 50 µm, was measured by the same method as in Example 1. It was 0.14% in the machine direction and 0.09% in the transverse direction. In both the directions, the copper layer was longer. When a sample of 200 mm×200 mm was cut out, curling having a radius of curvature of 30 mm occurred with the copper layer positioned outside. The FMCL may be usable as a substrate for an ordinary flexible printed circuit but is not suitable for TAB which requires a dimensional difference not greater than 0.05% between the metal layer and plastic layer. The flexural rigidity of the copper layer of the FMCL was 0.0025.cm (thickness: 4 µm; Young's apparent modulus under 3 kg/mm$^2$ tensile stress: 4200 kg/mm$^2$), which was not greater than 20 g.cm. On the other hand, the flexural rigidity of the poliyimide film was 0.36.cm (thickness: 50 µm; Young's apparent modulus under 1.5 kg/mm$^2$ tensile stress: 300 kg/mm$^2$), which was about 1/0.07 of the flexural rigidity of the copper layer, namely, greater than 1/500 of the flexural rigidity of the copper layer.

Using a zirconia blade whose shape was as shown in FIG. 10(h) and whose edge portion had a radius of curvature of 0.2 mm and a linearity within 30 µm, the FMCL was then continuously bent once at each of line-angles of +25° and −25° while maintaining the guide-in and guide-out angles at 80°, and then once at each of line angles of +25° and −25° while maintaining the guide-in and guide-out angles at 50°, namely, 4 times in total while applying a tension of 0.2 kg/cm and maintaining the copper layer in contact with the blade, thereby obtaining an FMCL whose copper layer had been subjected to compression plastic deformation.

Incidentally, as shown in FIGS. 8(1) and 8(2), guide rollers having a radius of curvature of 20 mm were provided both before and after the blade in such a way that the guide rollers are in parallel with the blade, the distances B and C were both 40 mm, and the parallelism with the blade was 20 μm. The rotation of the guide rollers was controlled to maintain the peripheral speed of the guide roller before the blade at 1 m/min and that of the guide roller after the blade at 0.5 m/min.

During the processing, no meandering took place at all and the running was very stable, and the FMCL was absolutely free from phenomena such as waving, ruggedness and puckering.

The FMCL obtained as described above was free of curling. When the dimensional difference between the polyimide layer and copper layer was measured in the same manner as in Example 1, it was 0.03–0.04% in the machine direction and also 0.03–0.04% in the transverse direction. It was hence possible to obtain very good FMCL which was substantially free of dimensional difference and curling and was usable suitably for TAB too.

EXAMPLE 4

One side of an elongated aluminum foil (material: 1070-0) having a thickness of 25 μm was treated with vinyltriethoxysilane. The thus-treated surface was coated with molten polyethylene, so that an FMCL having a polyethylene layer of 200μ thick was obtained. The percentage of shrinkage of the FMCL after its aluminum etching was 0.30% in the machine direction and 0.25% in the transverse direction.

Incidentally, the flexural rigidity of the aluminum layer employed in this Example was 1.03 g.cm (thickness: 25 μm; Young's modulus: 7000 kg/mm$^2$; testing method was the same as in Example 1) and that of the plastic layer was 1.59 g.cm (thickness: 200 μm; Young's modulus: 20 kg/mm$^2$; testing method was the same as in Example 1).

On a zirconia ceramic blade having a thickness of 1.0 mm and equipped with an edge whose radius of curvature was 0.15 mm, the FMCL was continually bent under a tension of 200 g/cm at a line angle of 35 degrees, running speed of 30 m/min, a guide-in angle of 60 degrees and a guide-out angle of 60 degrees while maintaining the aluminum layer in contact with the blade edge. Thereafter, the FMCL was continually bent again in the same manner as the aforementioned method except that the line angle was changed to −35 degrees. Both of the above operations were repeated again.

Regarding the FMCL obtained as described above, the percentage of compression plastic deformation of its aluminum layer was measured in the same manner as in Example 1. It was found to be 0.26% in the machine direction and 0.20% in the transverse direction. On the other hand, the dimensional difference between the aluminum layer and polyethylene layer of the FMCL was 0.04% in the machine direction and 0.06% in the transverse direction. The FMCL was hence found to be an FMCL in which the aluminum layer as a metal layer had been subjected to compression plastic deformation and the dimensional stability was good. In addition, this state remained completely unchanged even after an elapsed time of about half a year.

EXAMPLE 5

FMCL "KL-1001(2510)" (trade name; product of Mitsui-Toatsu Chemicals Incorporated), which was composed of a rolled copper foil of 35 μm thick and a "Kapton" (trade mark) film of 25 μm thick (product of Du Pont-Toray Co., Ltd.) laminated on the copper foil with an acrylic adhesive interposed therebetween, had been laminated under heat and pressure in the lamination step of the copper layer and plastic layer. In certain lots of that step, the tension was poorly balanced so that a greater tension was applied in the machine direction. As a result, the copper layer of the FMCL was stretched, and the dimensional difference between the copper layer and plastic layer was 0.35% in the machine direction and 0.08% in the transverse direction.

Incidentally, the flexural rigidity of the copper layer employed in this Example after having been processed through the heating step of the lamination procedure was 0.96 g.cm (thickness: 35 μm; Young's modulus: 2400 kg/mm$^2$; testing method was the same as in Example 1) and that of the plastic layer was 0.146 g.cm (thickness and Young's modulus of the "Kapton" film: 25 μm and 300 kg/mm$^2$; thickness and Young's modulus of the adhesive layer: 25 μm and 60 kg/mm$^2$; testing method was the same as in Example 1).

The FMCL was continually bent under a tension of 300 g/cm at a speed of 5 m/min on a high speed steel blade having a thickness of 1.0 mm and a radius of edge curvature of 0.4 mm while maintaining the copper layer in contact with the edge of the blade. Here, the line angle was 0 degree and the guide-in and guide-out angles were both 60 degrees. Next, the FMCL was continually bent again in the same manner as the above-described method except that the line angle was set at 10 degrees and the guide-in and guide-out angles were both changed to 50 degrees. The FMCL was continually bent further in the same manner as the method described right above except that the line angle was changed to −10 degrees.

Regarding the FMCL obtained as described above, the percentage of compression plastic deformation of its copper layer was measured in the same manner as in Example 1. It was 0.29% in the machine direction and 0.03% in the transverse direction. Further, the dimensional difference between the copper layer and plastic layer in the FMCL was found to be 0.07% in the machine direction and 0.05% in the transverse direction. The FMCL was hence conformed to be a good FMCL whose copper layer had been subjected to compression plastic deformation.

We claim:

1. A flexible metal clad laminate formed of at least one plastic layer and at least one metal layer laminated together, characterized in that the flexural rigidity of the metal layer is at most 20 g.cm, the flexural rigidity of the plastic layer is at least 1/500 of the flexural rigidity of the metal layer, and the metal layer has been subjected to compression plastic deformation in its plane direction to an extent of at least 0.01 percent but at most 5 percent.

2. The laminate as claimed in claim 1 wherein when the metal layer is etched on its entire surface, the percentage of shrinkage of the plastic layer is within ±0.3 percent based on the dimension of the laminate before the etching owing to the compression plastic deformation of the metal layer.

3. The laminate as claimed in claim 1 wherein the thickness of the metal layer is at least 0.05 μm but at most 100 μm.

4. The laminate as claimed in claim 1 wherein the thickness of the plastic layer is at least 1 μm but at most 200 μm.

5. The laminate as claimed in claim 1 wherein the metal layer is made of a member selected from the group consisting of copper, aluminum, nickel, gold, silver and an alloy thereof, and the metal layer is a single layer or is composed of more than two layers of different kinds of metal.

6. The laminate as claimed in claim 1 wherein the plastic layer is made of a member selected from the group consisting of an aromatic polyamide, aliphatic polyimide, aromatic polyimide precursor, aliphatic polyimide precursor, aromatic polyamide-imide, aliphatic polyamide-imide, aromatic polyamide, aliphatic polyamide, polyester, polyfluoroethylene, polyether sulfone, polyether ether ketone, polyethylene, polypropylene, polystyrene, polyvinyl chloride, a mixture of plural resin components including at least one component of the aforementioned resin and copolymer of plural resin components including at least one component of the aforementioned resin, and the plastic layer is a single layer or is composed of more than two layers of different kinds of plastic.

7. A method for reducing the dimensional different between a metal layer and a plastic layer of a flexible metal clad laminate, said laminate being formed of at least one plastic layer and at least one metal layer laminated together, the flexural rigidity of said metal layer being at most 20 g.cm and the flexural rigidity of said plastic layer being at least 1/500 of the flexural rigidity of the metal layer, said metal layer being longer than said plastic layer, characterized in that the flexible metal clad laminate is caused to slide under a tension of greater than 200 g/cm in contact with a blade, said blade having a curvature of radius of an edge portion, to which said metal layer is brought into contact, of smaller than 0.5 mm whereby the laminate is continually bent so as to subject the metal layer to compression plastic deformation in its plane direction to an extent of at least 0.01 percent but at most 5 percent.

8. The method as claimed in claim 7 wherein the accuracy of at least one vertical and transverse linearity of a portion of the blade, to which the flexible metal clad laminate is brought into contact, is within ±1 mm in the lengthwise direction.

9. The method as claimed in claim 7 wherein the flexible metal clad laminate is pressed from the side of the plastic layer by a guide provided in parallel and close proximity to an edge of the blade, to which the flexible metal clad laminate is brought into contact, before or after passage of the laminate by the blade.

10. The method as claimed in claim 7 wherein the flexible metal clad laminate is pressed from the side of the plastic layer by a guide roller provided in parallel and close proximity to an edge of the blade, to which the flexible metal clad laminate is brought into contact, before or after passage of the laminate by the blade.

11. The method as claimed in claim 10, wherein the rotation of the guide roller is controlled, in terms of the circumferential speed thereof, at a desired speed not higher than the speed equal to the travelling speed of the flexible metal clad laminate.

12. An apparatus for reducing an interlayer dimensional different of a flexible metal clad laminate, said laminate being formed of at least one metal layer and at least one plastic layer, said metal layer being longer than said plastic layer thereby having the interlayer dimensional difference therebetween, characterized in that the apparatus comprises a means for causing the flexible metal clad laminate to travel under a tension of greater than 200 g/cm, a blade provided in such a way that the blade extends across the travelling path of the laminate at an angle of from ±80° to −80° relative to the width-wise direction of the laminate and the metal layer of the laminate is brought into contact with the blade, said blade having a curvature of radius of an edge portion, to which said metal layer is brought into contact, of smaller than 0.5 mm, and a means for deflecting the laminate on the blade, whereby the flexible metal clad laminate is caused to slide under tension in contact with the blade and is hence continually bent so as to subject the metal layer to compression plastic deformation in its plane direction to an extent of at least 0.01 percent but at most 5 percent.

13. The apparatus as claimed in claim 12 wherein the accuracy of linearity of a portion of the blade, to which the flexible metal clad laminate is brought into contact, is within ±1 mm in at least one of the transverse and vertical directions.

14. The apparatus as claimed in claim 12 further comprising a guide provided in parallel and close proximity to an edge of the blade, to which the flexible metal clad laminate is brought into contact, whereby before or after passage of the laminate by the edge of the blade, the flexible metal clad laminate is pressed from the side of the plastic layer and is hence deflected by the blade.

15. The apparatus as claimed in claim 12 further comprising a guide roller provided in parallel and close proximity to an edge of the blade, to which the flexible metal clad laminate is brought into contact, whereby before or after passage of the laminate by the edge of the blade, the guide roller presses under rotation the flexible metal clad laminate from the side of the plastic layer and hence deflects the flexible metal clad laminate.

16. The apparatus as claimed in claim 15 wherein the rotation of the guide roller is controlled, in terms of the circumferential speed thereof, at a desired speed not higher than the speed equal to the travelling speed of the flexible metal clad laminate.

* * * * *